(12) United States Patent
Shindo

(10) Patent No.: US 11,939,696 B2
(45) Date of Patent: Mar. 26, 2024

(54) THIN PLATE-SHAPED SINGLE-CRYSTAL PRODUCTION EQUIPMENT AND THIN PLATE-SHAPED SINGLE-CRYSTAL PRODUCTION METHOD

(71) Applicant: Crystal Systems Corporation, Hokuto (JP)

(72) Inventor: Isamu Shindo, Hokuto (JP)

(73) Assignee: Crystal Systems Corporation, Hokuto (JP)

( * ) Notice: Subject to any disclaimer, the term of this patent is extended or adjusted under 35 U.S.C. 154(b) by 162 days.

(21) Appl. No.: 17/610,890

(22) PCT Filed: Feb. 12, 2021

(86) PCT No.: PCT/JP2021/005139
§ 371 (c)(1),
(2) Date: Nov. 12, 2021

(87) PCT Pub. No.: WO2022/130651
PCT Pub. Date: Jun. 23, 2022

(65) Prior Publication Data
US 2022/0411957 A1    Dec. 29, 2022

(30) Foreign Application Priority Data

Dec. 15, 2020 (JP) ................. 2020-207337
Jan. 8, 2021 (JP) ................. 2021-002285

(51) Int. Cl.
*C30B 15/10* (2006.01)
*C30B 15/16* (2006.01)
(Continued)

(52) U.S. Cl.
CPC .............. *C30B 15/16* (2013.01); *C30B 15/10* (2013.01); *C30B 15/30* (2013.01); *C30B 23/00* (2013.01); *C30B 35/002* (2013.01)

(58) Field of Classification Search
CPC ....... C30B 15/002; C30B 15/10; C30B 15/16; C30B 15/30; C30B 23/00; C30B 29/06; C30B 35/002
See application file for complete search history.

(56) References Cited

U.S. PATENT DOCUMENTS 4,650,541 A * 3/1987 Ciszek ............... C30B 15/06
117/34
5,122,504 A * 6/1992 Gazit ............... C30B 29/225
505/739
(Continued)

FOREIGN PATENT DOCUMENTS

JP  H05294791 A   11/1993
JP  5279727 B2     9/2013
(Continued)

OTHER PUBLICATIONS

Luh, et al., "Stoichiometric LiNbO3 Single-Crystal Fibers for Nonlinear Optical Applications", Journal of Crystal Growth, 1987, pp. 264-269, vol. 85.
(Continued)

*Primary Examiner* — Matthew J Song
(74) *Attorney, Agent, or Firm* — The Webb Law Firm

(57) ABSTRACT

[Object] To provide a thin plate-shaped single-crystal production equipment and a thin plate-shaped single-crystal production method that can produce a thin plate-shaped single crystal having a uniform dopant concentration at an optimum chemical composition and a thickness of several hundreds of micrometers continuously at low cost with high precision even when the single crystal is a single crystal of an incongruent melting material or a solid solution material or a single crystal of a congruent melting material.
[Solution] Thin plate-shaped single-crystal production equipment includes: an infrared ray irradiation apparatus that irradiates an upper surface of a raw material lump for production of a thin plate-shaped single crystal with an infrared ray to melt the upper surface; and an elevator
(Continued)

apparatus that causes a lower surface of a thin plate-shaped seed single crystal to be immersed in a melt melted using the infrared ray irradiation apparatus and formed on the upper surface and then pulls the thin plate-shaped seed single crystal immersed in the melt upward. The thin plate-shaped single-crystal production equipment is configured such that, by using the elevator apparatus to immerse the lower surface of the thin plate-shaped seed single crystal in the melt formed on the upper surface of the raw material lump for the production of the thin plate-shaped single crystal using the infrared ray irradiation apparatus, growth of a single crystal is started from the lower surface of the immersed thin plate-shaped seed single crystal and that, by using the elevator apparatus to pull the thin plate-shaped seed single crystal upward, the thin plate-shaped single crystal is produced continuously.

21 Claims, 13 Drawing Sheets

(51) Int. Cl.
*C30B 15/30* (2006.01)
*C30B 23/00* (2006.01)
*C30B 35/00* (2006.01)

(56) References Cited

U.S. PATENT DOCUMENTS

| | | | |
|---|---|---|---|
| 7,449,065 B1* | 11/2008 | Powell | C30B 29/36 |
| | | | 117/109 |
| 2010/0307406 A1 | 12/2010 | Shindo | |
| 2012/0309632 A1* | 12/2012 | Goyal | C30B 29/16 |
| | | | 174/125.1 |
| 2018/0051389 A1* | 2/2018 | Maxwell | C03B 37/011 |

FOREIGN PATENT DOCUMENTS

| | | |
|---|---|---|
| JP | 2016147800 A | 8/2016 |
| JP | 2018516829 A | 6/2018 |
| WO | 2009081811 A1 | 7/2009 |
| WO | 2016153537 A1 | 9/2016 |

OTHER PUBLICATIONS

Sheftal, "Letters to the Editor: Growth of Controlled Profile Crystals from the Melt", Material Research Bulletin, 1972, pp. 345-348, vol. 7:4.

* cited by examiner

[Fig. 1]
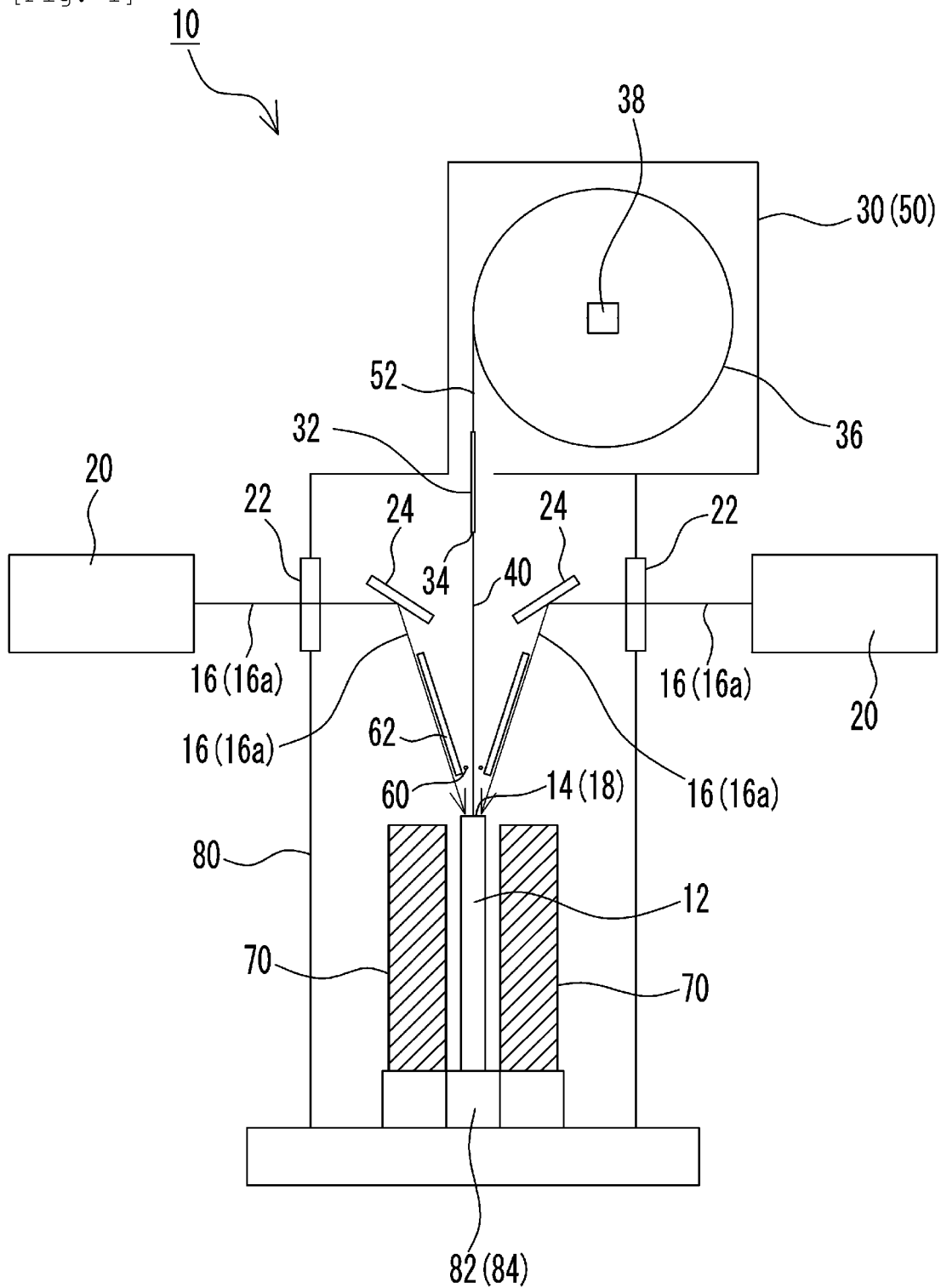

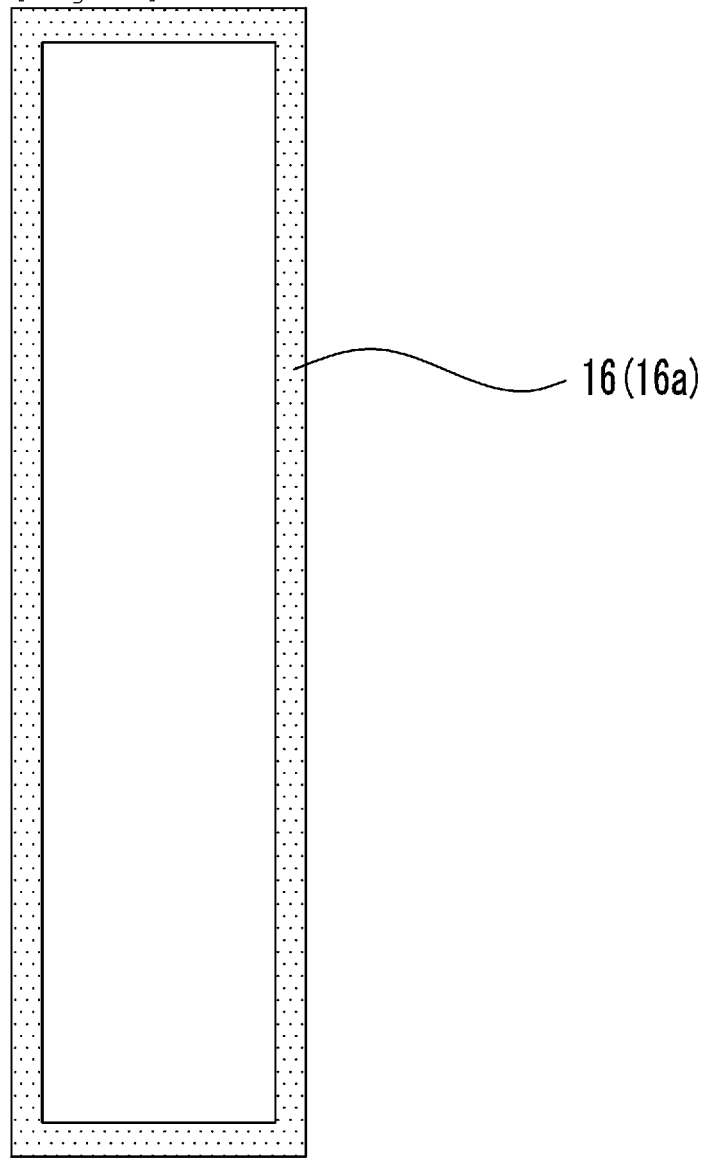

[Fig. 3]
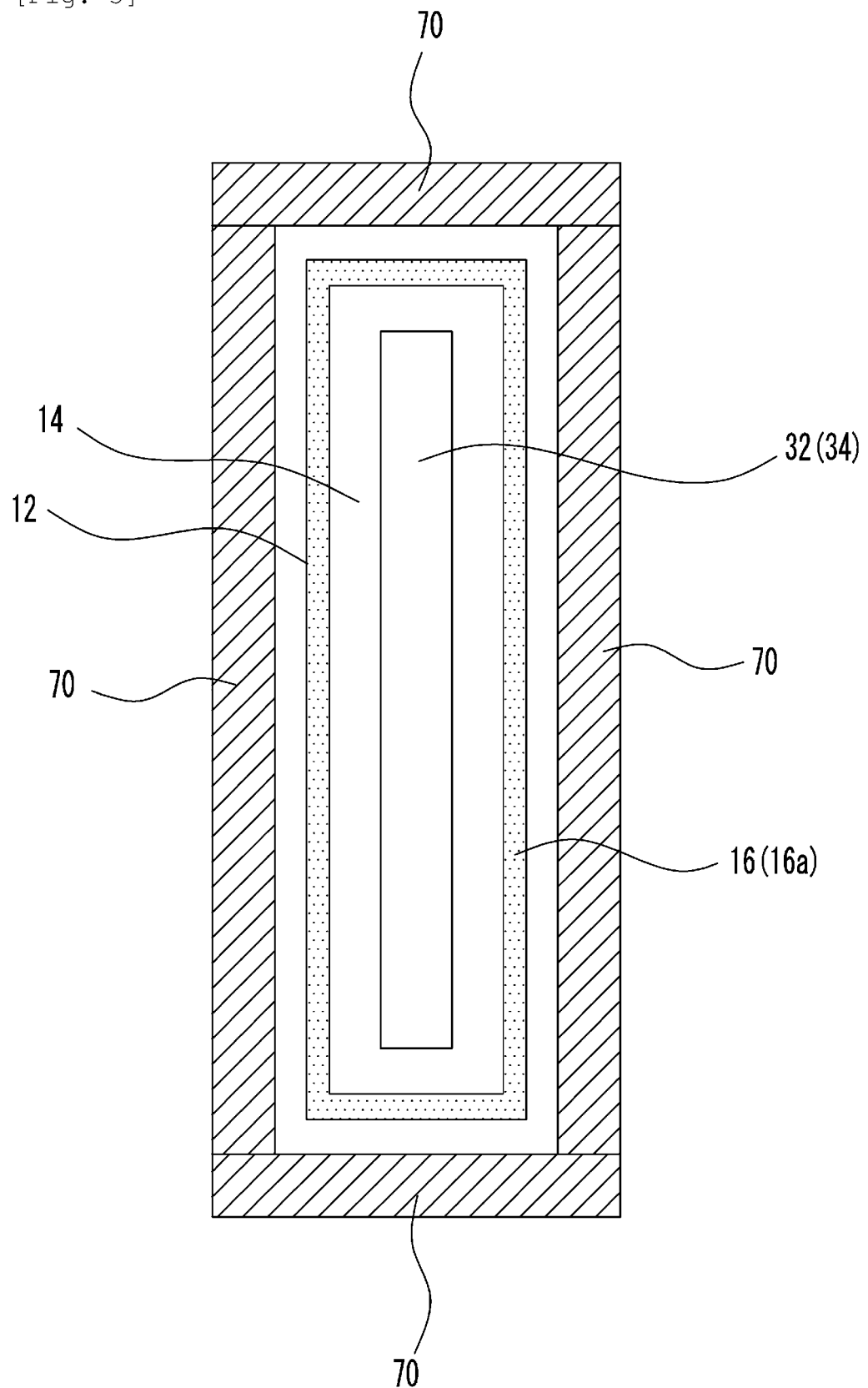

[Fig. 4]
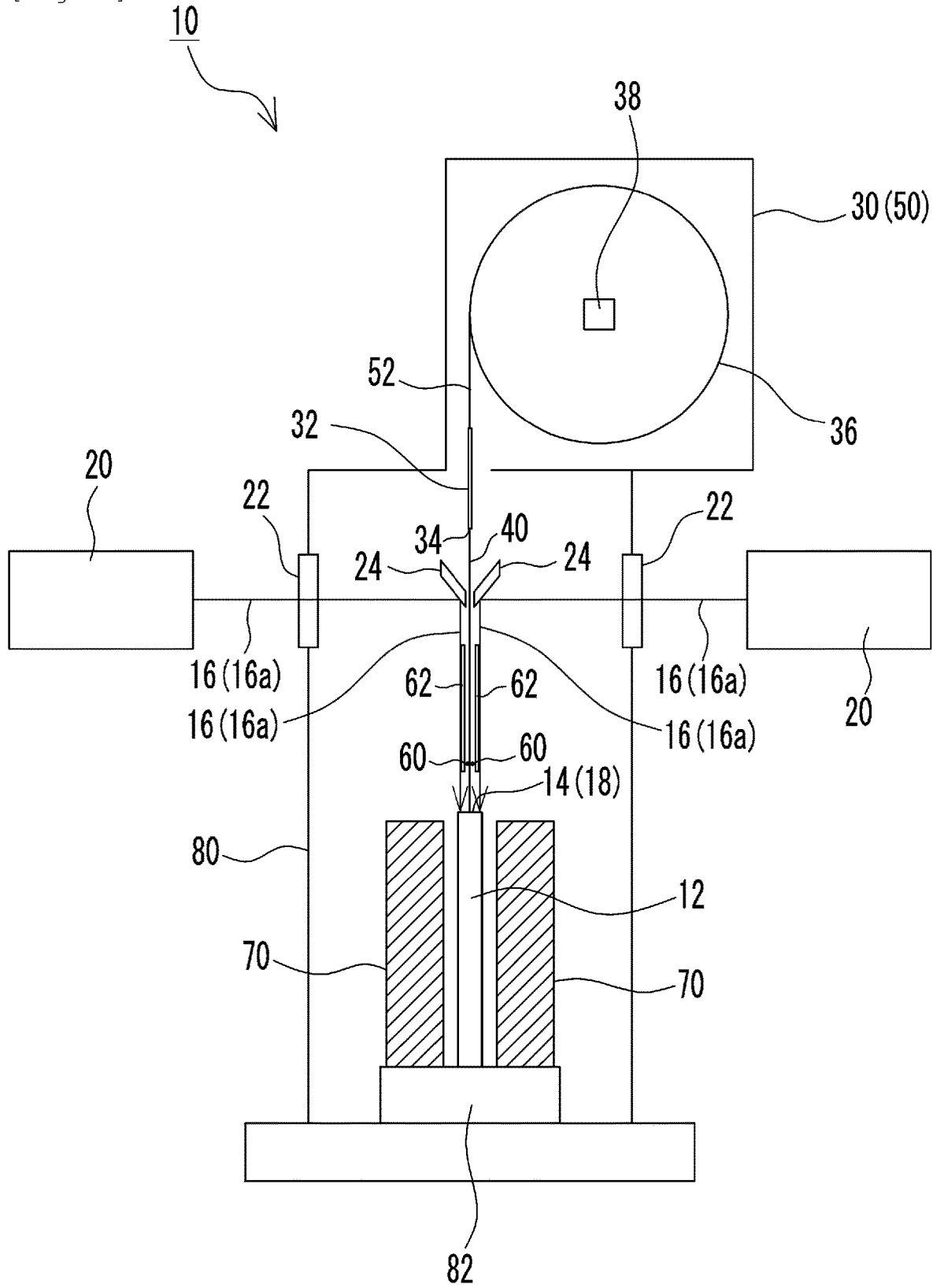

[Fig. 5]
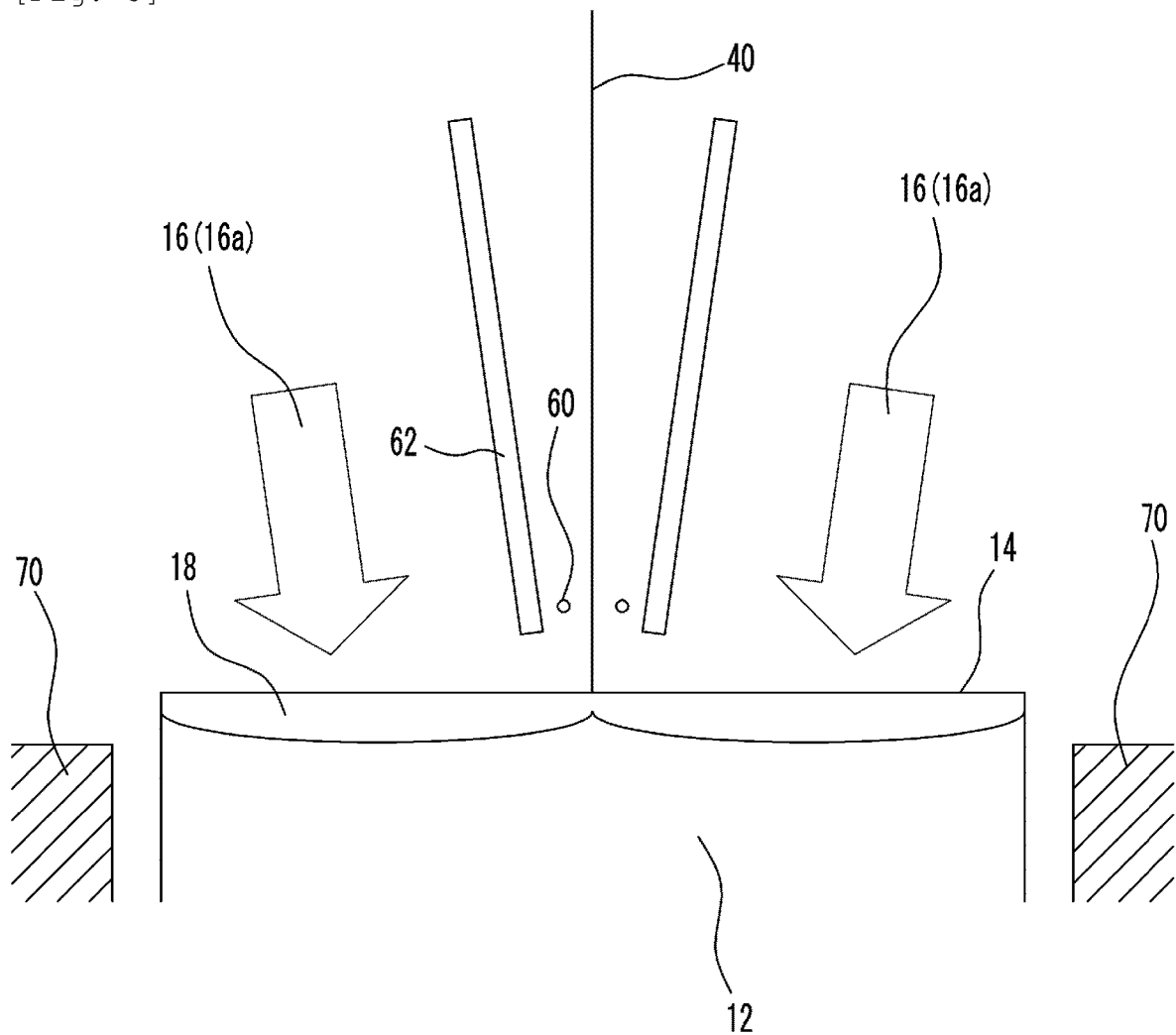

[Fig. 6]
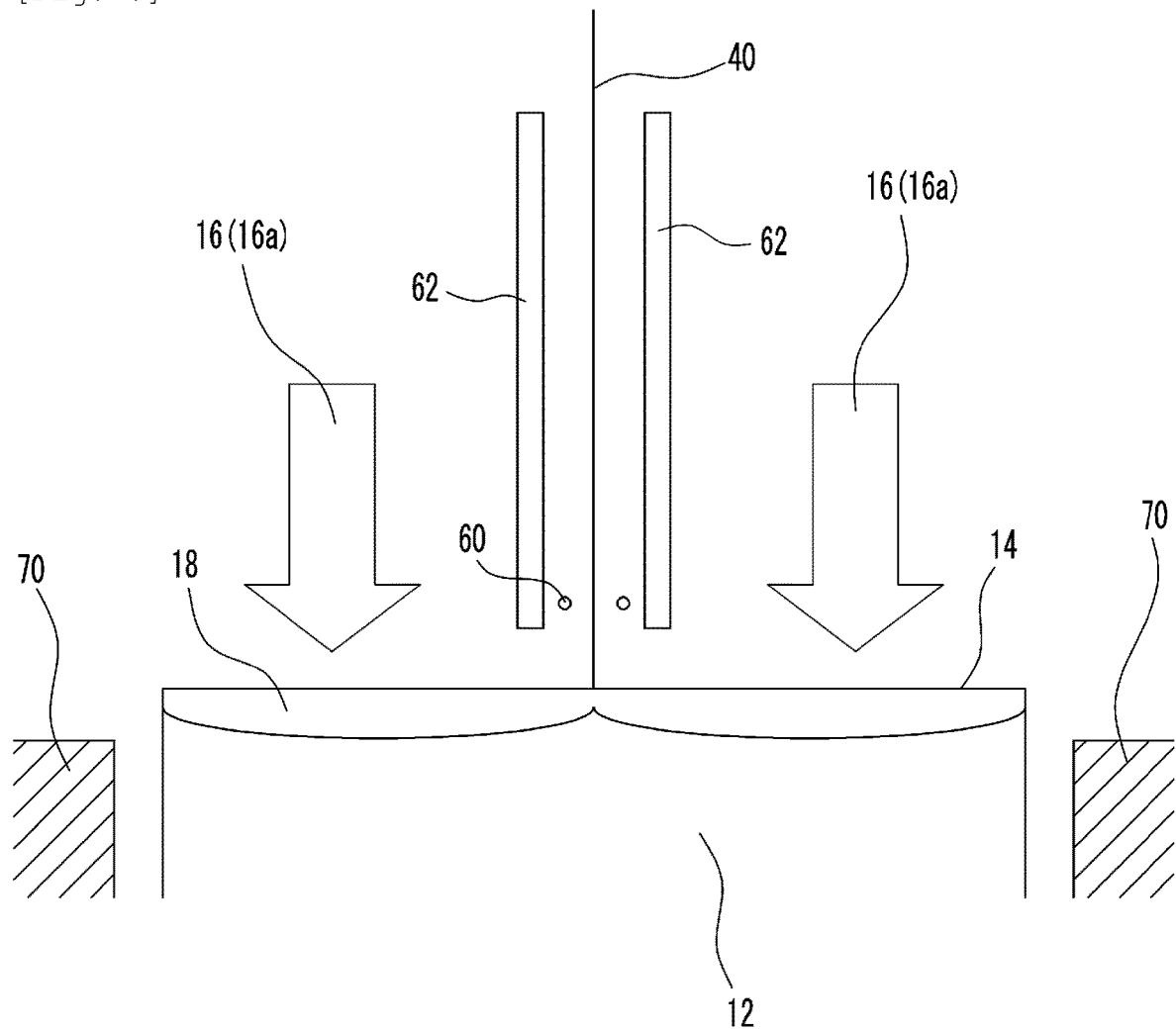

[Fig. 7]
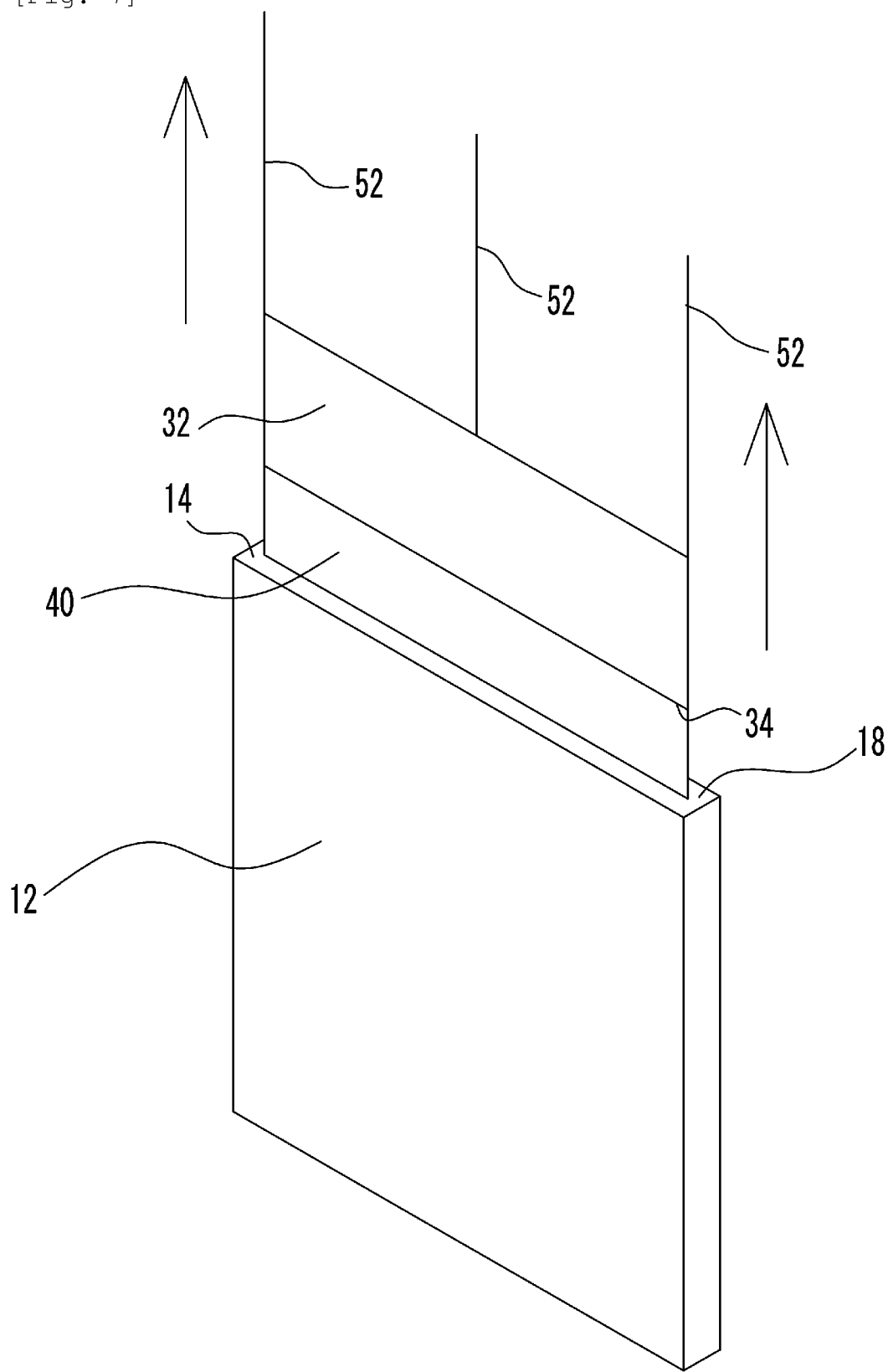

[Fig. 8]
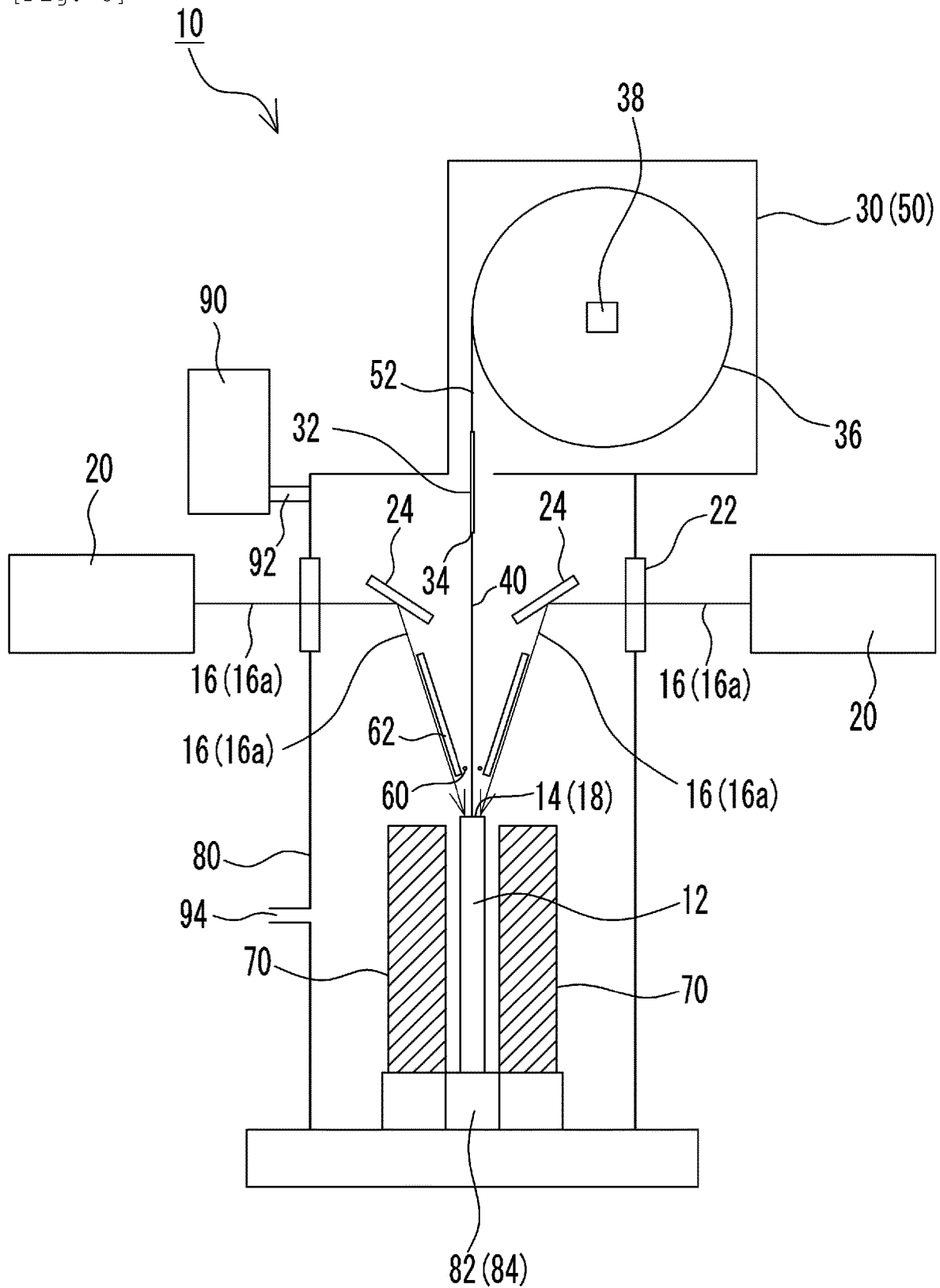

[Fig. 9]
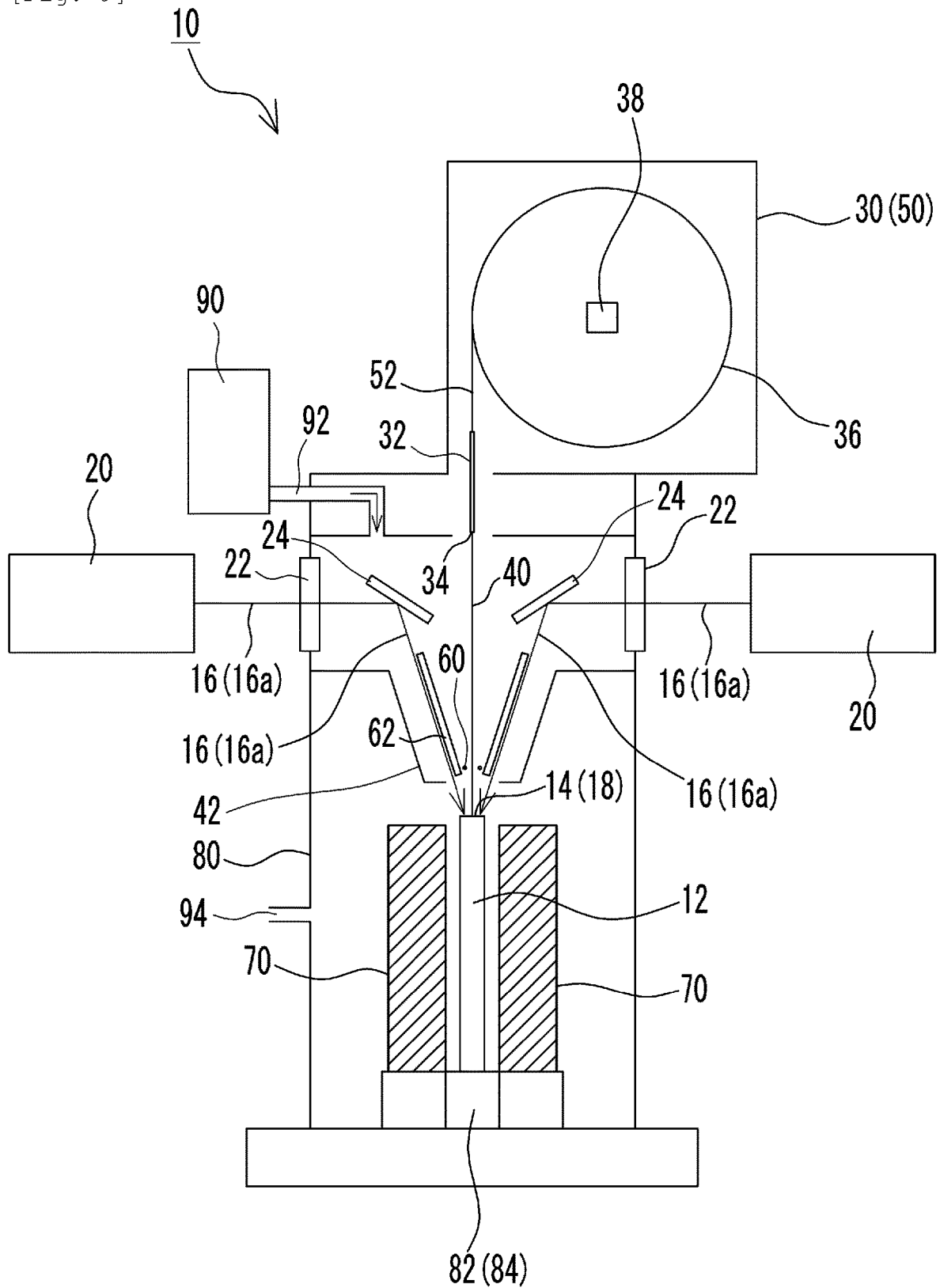

[Fig. 10]
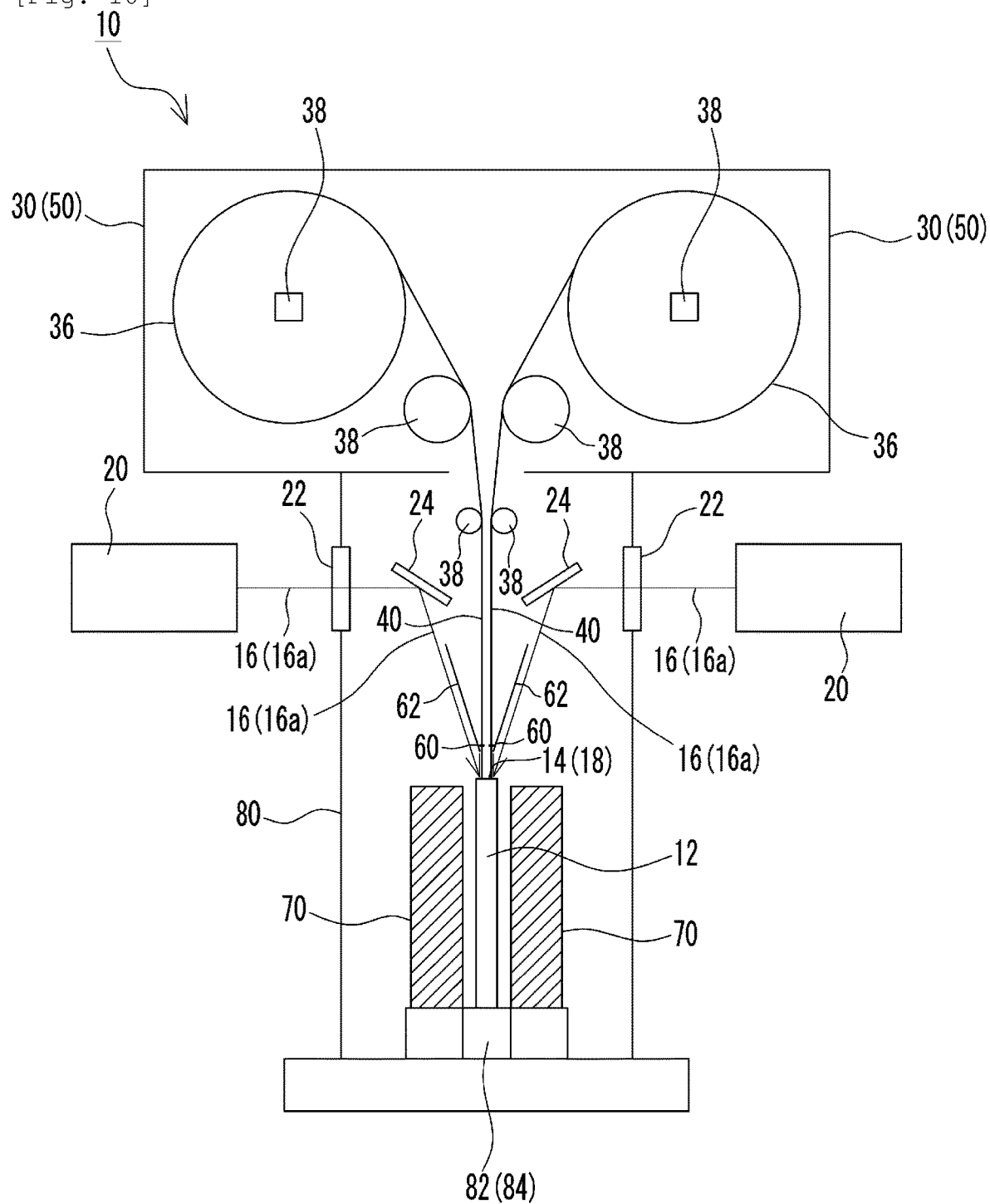

[Fig. 11]
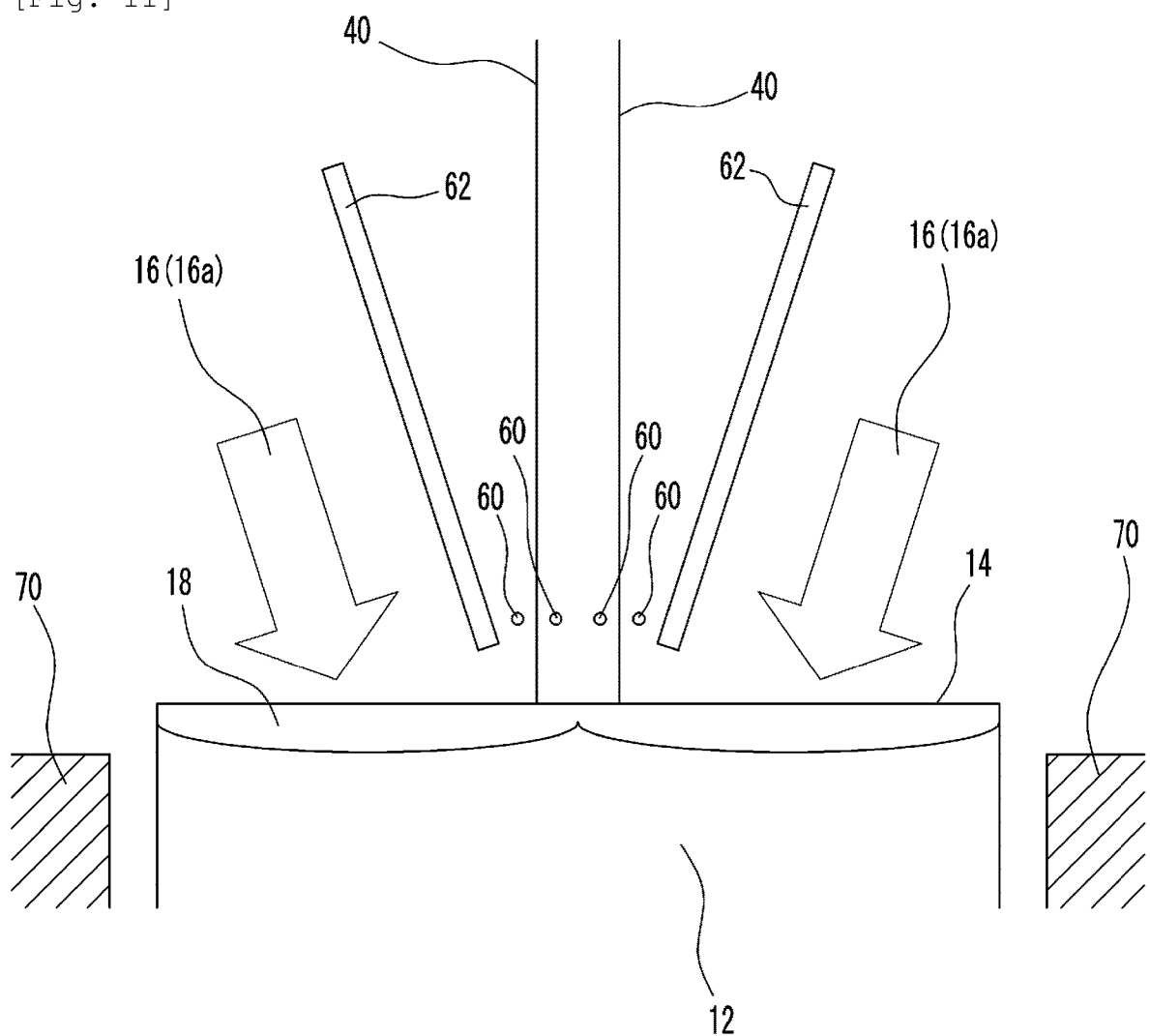

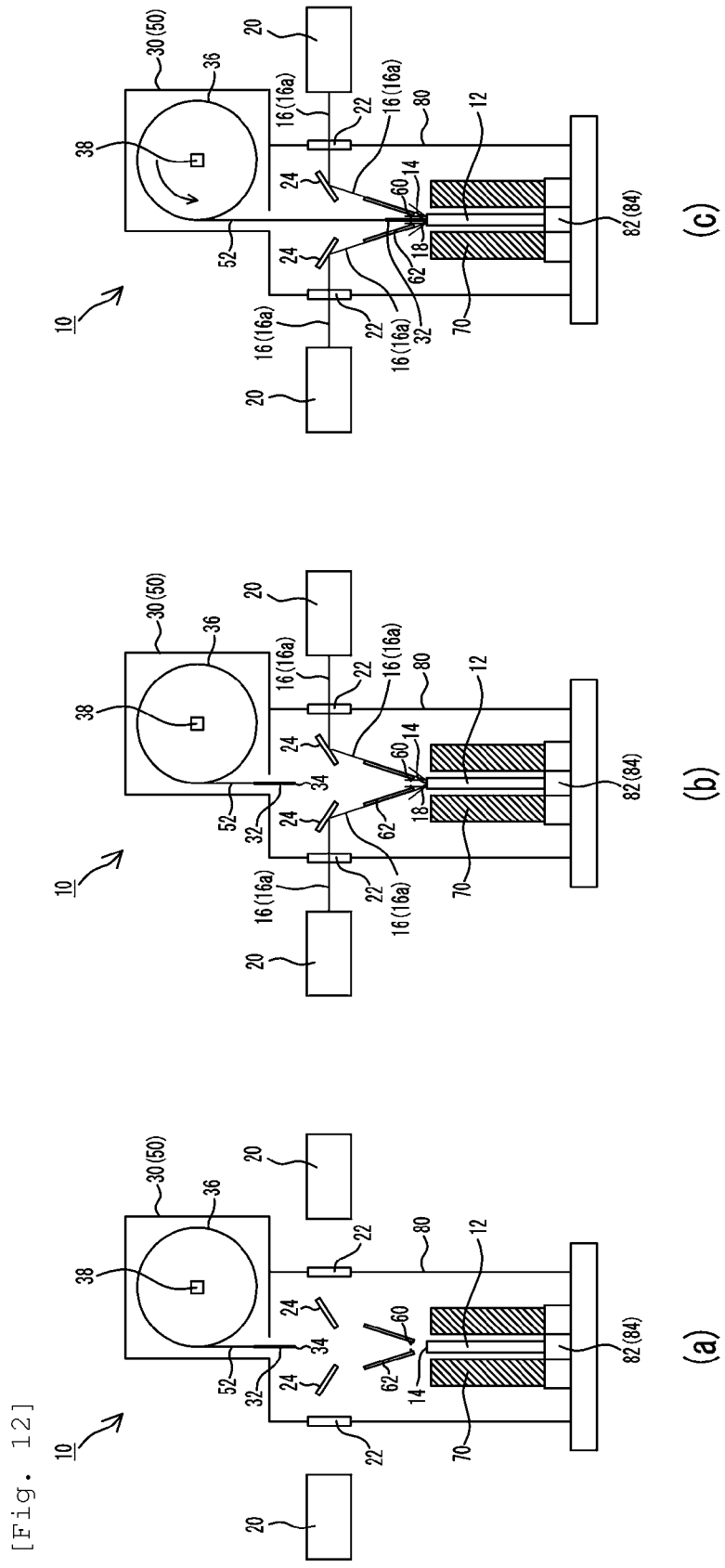
[Fig. 12]

[Fig. 13]
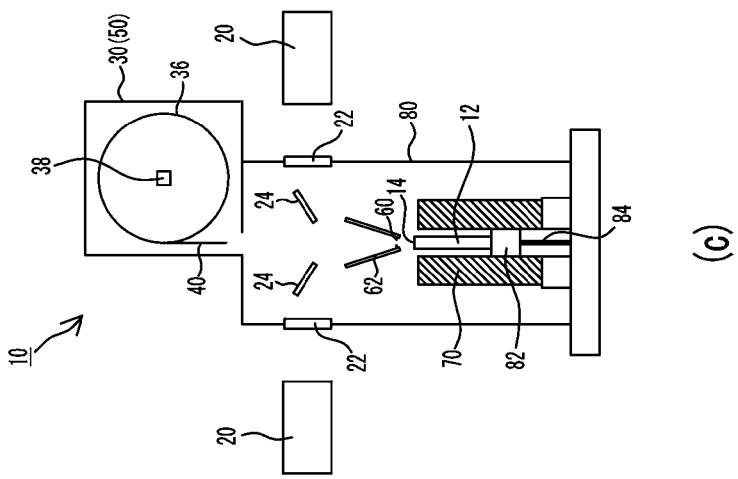
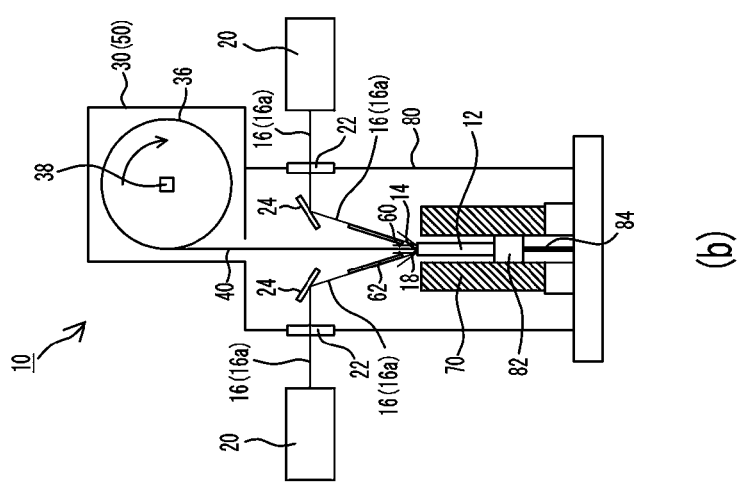
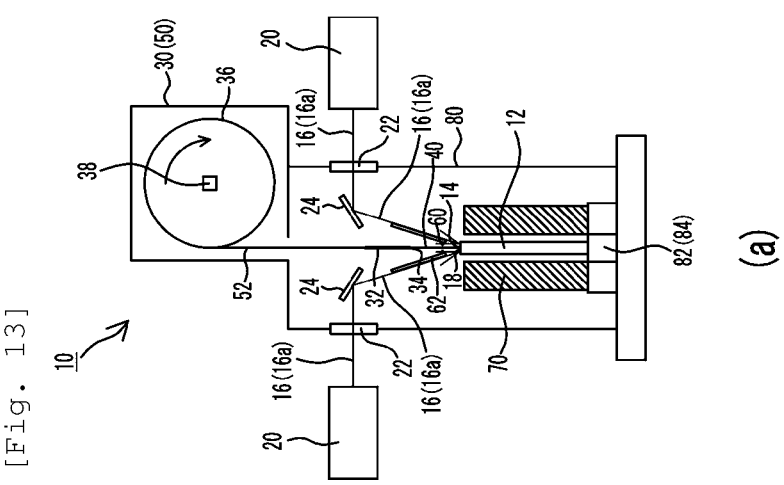

THIN PLATE-SHAPED SINGLE-CRYSTAL PRODUCTION EQUIPMENT AND THIN PLATE-SHAPED SINGLE-CRYSTAL PRODUCTION METHOD

CROSS-REFERENCE TO RELATED APPLICATIONS

This application is the United States national phase of International Application No. PCT/JP2021/005139 filed Feb. 12, 2021, and claims priority to Japanese Patent Application Nos. 2020-207337 filed Dec. 15, 2020, and 2021-002285 filed Jan. 8, 2021, the disclosures of which are hereby incorporated by reference in their entirety.

TECHNICAL FIELD

The present invention relates to a thin plate-shaped single-crystal production equipment and a thin plate-shaped single-crystal production method that can continuously produce a thin plate-shaped single crystal having a thickness of several hundreds of micrometers.

BACKGROUND ART

In recent years, there has been a growing need to replace fossil fuels with renewable energy, and petroleum-consuming power generation methods are being replaced with power generation methods using solar batteries on a worldwide scale. However, the power generation cost of the solar photovoltaic power generation is still higher than that of other power generation methods, and there is a need for the development of high-efficiency low-cost solar batteries.

Various materials such as semiconductor silicon crystals, amorphous silicon, and compound semiconductors are known to be used as a substrate material included in solar batteries, and the development of these materials is being pursued. Of these, semiconductor silicon crystals are primary substrate materials. The universal size of the substrate is about 155 mm square and a thickness of about 0.3 mm. A product produced by subjecting a universal size silicon crystal substrate to treatment that allows solar photovoltaic power generation with high efficiency and attaching thereto electrodes for outputting electric power generated is referred to as a "cell." A product including a large number of cells arranged two-dimensionally is referred to as a "module." The module is installed according to its use environment and used as a solar photovoltaic power generation device.

To reduce the power generation cost of solar batteries, it is important to improve the performance of a substrate formed of semiconductor silicon crystals and used as a main component of cells and to develop a novel production method that allows a reduction in the production cost of the substrate material.

Solar batteries of the type called the HIT (Heterojunction with Intrinsic Thin-layer) type are solar batteries that can generate electric power with high efficiency and have a structure in which a phosphorus-doped N-type silicon single crystal plate is sandwiched between amorphous silicon layers to increase the usable wavelength range of sunlight.

It is known that the highest efficiency is achieved by the combined use of the HIT type and a back-contact type in which all electrodes for outputting the generated electricity are collected on the back side to eliminate electrodes on the front side. In the N-type silicon single crystal substrate used in this case, phosphorus must be added uniformly at an optimum chemical composition.

At present, there are two primary methods for producing silicon crystal substrates for general-purpose solar batteries. One of these methods is a unidirectional solidification method. In this method, a raw material is melted in a large quartz-made crucible and solidified from the lower side to the upper side. Then the obtained large bulk crystals are cut into universal size pieces to thereby produce crystal substrates.

However, the bulk crystals produced by the above method are boron-doped P-type polycrystals, and the unidirectional solidification method cannot be used in principle for the production of an N-type single crystal substrate necessary for the high-efficiency solar batteries described above.

The second method is the following method. A so-called pulling method including melting a raw material in a quartz crucible, immersing a seed single crystal in the obtained melt, and pulling the seed single crystal upward while the crystal is allowed to grow is used to produce a round rod-shaped single crystal. Then the produced round rod-shaped single crystal is cut to produce crystal substrates with a universal size.

The pulling method has two major problems. One of them is that the unit production cost is high.

The production cost of the single crystal rod obtained by the pulling method increases as the diameter of the single crystal rod increases. To obtain universal size substrates, a single crystal rod having a diameter of about 250 mm is necessary. However, universal size substrates are generally produced using a single crystal rod having a diameter of about 200 mm in order to reduce the production cost. In this case, the substrates have a quadrangular shape with four rounded corners, and their efficiency is lower than that of a substrate having an exact quadrangular shape.

The second problem of the pulling method is that the concentration of phosphorus added to obtain the N-type semiconductor cannot be made uniform. The phosphorus concentration in the melt of the raw material silicon doped with phosphorus is uniform. However, the phosphorus concentration of a portion solidified first as a single crystal is lower than the phosphorus concentration of the melt. This phenomenon is referred to as a "distribution phenomenon," and the ratio between the phosphorus concentration in the melt and the phosphorus concentration in the solidified product is referred to as a "distribution coefficient."

In the case of silicon, the distribution coefficient of phosphorus is about 0.35. Therefore, the phosphorus concentration of the portion solidified first is low, and the rest remains in the melt. Thus, the phosphorus concentration in the melt increases during solidification, and the phosphorus concentration in the solidified product increases according to the distribution coefficient. Therefore, a portion having an optimum chemical composition is present in only part of the single crystal.

Moreover, when about one half of the raw material melted first in the crucible is solidified, the phosphorus concentration becomes excessively high, so that the solidified product cannot be used for solar batteries. In this case, the following production method is used. The single crystal production operation is stopped. Then an inert atmosphere introduced into a production furnace is maintained, and the product is removed while the temperature of the raw material melt is maintained. Then a new particulate raw material is added to the remaining raw material melt to recover the initial chemical composition of the raw material melt. Then the production of a second single crystal is resumed.

In this production method, the quartz crucible holding the raw material melt is consumed. Therefore, the number of repeated uses of the quartz crucible is 2. Even when a specially prepared high-quality quartz crucible is used, the number of repeated uses of this quartz crucible is at most 3.

The largest problem with this production method is that the phosphorus concentration in the product cannot be made uniform. When solar battery cells are produced using only products having an optimum chemical composition, high efficiency can be achieved. However, the cost of the products with an optimum chemical composition is high, and this directly leads to an increase in power generation cost.

Therefore, when products having a lower phosphorus concentration than the products having the optimum chemical composition or products having a larger phosphorus concentration than the products having the optimum chemical composition are used to reduce the cost, the power generation efficiency of the module of course deteriorates.

Methods for reducing the production cost of silicon single crystal substrates for solar batteries other than the above methods have been vigorously developed. Of course, the possibility of reducing cutting wastes and production cost is higher when a thin plate single crystal having a prescribed thickness is produced from the beginning and then cut into pieces with a prescribed size than when a large bulk crystal is cut to produce thin plate single crystals.

Previously proposed thin plate-shaped silicon crystal production methods include three types of methods.

A first method is a method for producing a thin plate-shaped single crystal by inserting a jig called a die having a slit in a raw material melt melted in a crucible, immersing a thin plate-shaped seed single crystal in the raw material melt coming out to an upper portion of the die through the slit due to surface tension, and pulling the raw material melt upward while the raw material melt is allowed to solidify. This method is referred to as an EFG (Edge defined Film-fed Growth) method.

This production method has been vigorously developed mainly in the United States but has not been practically used for production of silicon substrates for solar batteries. The reasons for this are as follows. The material of the jig that can be stably used for a long time cannot be found, and it is difficult to control the temperature during solidification of the raw material melt, so that it is difficult to increase the size of the product.

A second method is a method named an ESR (Edge Stabilized Ribbon) method and using a string instead of the die. In the ESR method, first, a string is immersed in the surface of the raw material melt so as to extend horizontally and then slightly raised. Then the raw material melt raised together with the string due to surface tension is solidified and forms thin plate-shaped crystals.

Strings are connected to both sides of the string and raised together, and the solidified thin plate-shaped crystals are also raised while growing. In this method, the portion first raised together with the string and then solidified is a "polycrystal", and the thin plate grown together with this portion is also a "polycrystal" and is not a "single crystal."

A third method is a method named a dendritic web growth method. The dendrite has the property that, when the growth rate reaches a certain rate, the growth proceeds preferentially in a high thermal conductivity direction. This method utilizes this property of the dendrite to produce thin plate-shaped crystals.

Unlike the EFG method and the ESR method, this method uses no jig and no string and is thought to allow a single crystal to grow by controlling the growth optimally. However, in practice, a single crystal cannot be produced unless the initial dendrite is a single dendrite. There is no precedent for the continuous growth of a large and long thin plate-shaped single crystal using this method, and industrial production has not been achieved.

As described above, the previously reported thin plate-shaped crystal production methods are each a method for producing a crystal using a silicon melt held in a quartz crucible. When raw material silicon is melted in a quartz crucible as in these production methods, the silicon melt reacts with quartz as shown in formula 1 to form silicon monoxide (SiO).

[Math. 1]

$$SiO_2 + Si \rightleftharpoons 2SiO \qquad \text{(formula 1)}$$

The silicon monoxide (SiO) formed by the reaction is mixed into the silicon crystal product, forms a solid solution, and is a main cause of deterioration of the performance of the single crystal. Therefore, to produce a high-quality single crystal, it is preferable to use a production method in which it is unnecessary to use a quartz crucible.

One practical method currently used for producing a silicon single crystal without using a crucible is a high-frequency floating-zone melting method for producing a single crystal by melting a raw material rod using high-frequency induction heating and solidifying the melted raw material (e.g., PTL 1: Japanese Patent No. 5279727). With the high-frequency floating-zone melting method, a high-purity single crystal containing no silicon monoxide (SiO) in the product can be obtained.

However, the raw material rod usable for the high-frequency floating-zone melting method is a specially prepared highly dense product. This raw material rod is expensive, and its supply amount is limited, so that the high-frequency floating-zone melting method is not suitable for solar batteries expected to be low cost. Moreover, with the high-frequency floating-zone melting method, it is very difficult to produce a thin plate-shaped single crystal, and there has been no report on the production of a thin plate-shaped single crystal.

Another known method for producing a high-purity single crystal without using a crucible is a method using an infrared ray. One known method for producing a single crystal using an infrared ray is an infrared floating-zone melting method for producing a single crystal rod by forming a raw material powder into a rod shape, subjecting the rod to local heating to melt the rod, and solidifying the melt.

In the infrared floating-zone melting method, the melt formed by heating using the infrared ray is held on the raw material rod through the surface tension of the melt itself to continue the melting and solidification of the raw material.

In the infrared floating-zone melting method, a method in which irradiation with the infrared ray is performed in a horizontal direction is conventionally used. However, with the horizontal irradiation method, a single crystal having a large diameter cannot be produced in principle.

Accordingly, an upper surface melting method has been developed which can produce a single crystal having a large diameter by irradiating the upper surface of a large-diameter seed single crystal disposed in a lower portion with an infrared ray to melt it and adding dropwise a raw material melt prepared by melting a raw material onto the upper surface. With the upper surface melting method, no limitation is in principle imposed on the diameter of a producible single crystal, so that the applicable range of the method has been increased dramatically.

Currently used industrial single crystal materials include, in addition to the above materials for solar batteries, various oxide materials including ferroelectric materials such as lithium niobate and lithium tantalate, fluorescent materials such as lutetium silicate and gadolinium silicate, and laser materials such as yttrium aluminum garnet and gadolinium gallium garnet.

Each of these oxide materials is used to produce a round rod-shaped single crystal by the pulling method. The round rod-shaped single crystal is cut into thin plate-shaped single crystals having a thickness of about 0.3 mm, and the single crystals are used for various devices. However, with the pulling method, contamination from the crucible material to the product cannot be avoided. Moreover, the concentration of a useful dopant in the product cannot in principle be made uniform because of the distribution phenomenon described above. Therefore, problems occur in the production of high-quality devices.

Therefore, a high-performance product can be produced at much lower cost when a thin plate-shaped single crystal having an optimum chemical composition and a prescribed thickness is produced from the beginning and used than when a round rod-shaped single crystal is produced and cut into a thin plate-shaped single crystal.

SUMMARY OF INVENTION

Technical Problem

However, the results of the previous research and development on the thin plate-shaped single-crystal production methods are insufficient, and the industrial application of the production of a thin plate-shaped single crystal is limited only to the production of a sapphire single crystal plate, a gallium oxide single crystal plate, etc. using the EFG method.

The present invention has been made in view of the foregoing circumstances, and it is an object to provide a thin plate-shaped single-crystal production equipment and a thin plate-shaped single-crystal production method that can continuously produce at low cost with high precision a thin plate-shaped single crystal having a uniform dopant concentration at an optimum chemical composition and having a thickness of several hundreds of micrometers.

Solution to Problem

The present invention has been made to solve the problems in the conventional technologies.

The thin plate-shaped single-crystal production equipment of the present invention includes:
an infrared ray irradiation apparatus that irradiates an upper surface of a raw material lump for production of a thin plate-shaped single crystal (hereinafter referred to also as a raw material lump) with an infrared ray to melt the upper surface; and
an elevator apparatus that causes a lower surface of a thin plate-shaped seed single crystal to be immersed in a melt melted using the infrared ray irradiation apparatus and formed on the upper surface and then pulls the thin plate-shaped seed single crystal immersed in the melt upward,
wherein the thin plate-shaped single-crystal production equipment is configured such that, by using the elevator apparatus to immerse the lower surface of the thin plate-shaped seed single crystal in the melt formed on the upper surface of the raw material lump for the production of the thin plate-shaped single crystal using the infrared ray irradiation apparatus, growth of a single crystal is started from the lower surface of the immersed thin plate-shaped seed single crystal and that, by using the elevator apparatus to pull the thin plate-shaped seed single crystal upward, the thin plate-shaped single crystal is produced continuously.

In the above structure, the number of members forming the equipment is small, and a thin plate-shaped single crystal having a uniform dopant concentration at an optimum chemical composition and having a thickness of several hundreds of micrometers can be produced at low cost with high precision. Moreover, a uniform chemical composition thin plate-shaped single crystal of a non-congruent melting material such as an incongruent melting material or a solid solution material can be produced with high precision.

The thin plate-shaped single-crystal production equipment of the present invention is characterized in that
the infrared ray emitted from the infrared ray irradiation apparatus is a laser beam.

When the infrared ray is the laser beam, a prescribed area of the raw material lump can be heated precisely. Therefore, the melt (melt pool) can be formed continuously in a reliable manner without spilling of the melt from the upper surface of the raw material lump.

The thin plate-shaped single-crystal production equipment of the present invention is also characterized in that:
a shape of an irradiation area irradiated with the laser beam is a hollow quadrangular shape elongated in a horizontal direction; the thin plate-shaped single-crystal production equipment being configured for a circumferential area of the upper surface of the raw material lump for the production of the thin plate-shaped single crystal to be irradiated with the laser beam such that the hollow quadrangular irradiation area is formed in the circumferential area of the upper surface, the circumferential area excluding a central portion of the upper surface.

By irradiating the circumferential area, excluding the central portion, of the upper surface of the raw material lump with the laser beam such that the laser beam is fitted in the circumferential area and that the hollow quadrangular irradiation area is formed in the circumferential area, the circumferential area, excluding the central portion, of the upper surface of the raw material lump is first melted, and the central portion not irradiated with the laser beam is melted by heat transferred from the melt in the circumferential area melted first.

Therefore, the temperature of the central portion can be controlled so as to be lower than the temperature of the circumferential area. To form the hollow quadrangular irradiation area irradiated with the laser beam, the hollow quadrangular irradiation area may be irradiated with, for example, linear laser beams from four sides.

The upper surface of the raw material lump may be irradiated with the laser beam obliquely from above or vertically from above. It is preferable that the irradiation angle can be adjusted to an optimum angle according to the thermal conduction properties of the single crystal material or the thickness of the thin plate-shaped single crystal to be produced.

To produce the thin plate-shaped single crystal continuously by melting the raw material lump, it is necessary to continuously melt the raw material lump and solidify the thin plate-shaped single crystal simultaneously. However, it is necessary to heat the raw material lump to melt it, and it is necessary to cool the melt to solidify the thin plate-shaped single crystal.

Therefore, to allow the thin plate-shaped single crystal to be produced stably, contradictory actions, i.e., "heating" and "cooling," must be continued stably in a well-controllable manner. By irradiating the raw material lump with the hollow quadrangular laser beam, the above actions can be achieved.

Specifically, when the melt pool on the upper surface of the raw material lump has the above temperature distribution, the thin plate-shaped single crystal can be grown from the central portion stably and continuously.

The thin plate-shaped single-crystal production equipment of the present invention is also characterized in that:
the elevator apparatus includes
a winding apparatus that continuously winds the thin plate-shaped single crystal to be produced into a roll;
the winding apparatus includes
a winding shaft that winds the thin plate-shaped single crystal continuously and
a rotating apparatus that rotates the winding shaft; and
the thin plate-shaped single-crystal production equipment is configured such that the thin plate-shaped seed single crystal is suspended from the winding shaft.

With the winding apparatus having the above structure, the thin plate-shaped single crystal produced continuously can be reliably wound around the winding shaft, and the size of the equipment is not increased unnecessarily. Moreover, since the thin plate-shaped single crystal produced is in the form of a roll, the thin plate-shaped single crystal can be easily conveyed during shipment, so that its handleability is high.

The thin plate-shaped single-crystal production equipment of the present invention is also characterized in that
the thin plate-shaped seed single crystal is suspended from the winding shaft using a plurality of thin lines.

When the thin plate-shaped seed single crystal is suspended using heat resistant high-strength thin lines, the thin plate-shaped single crystal produced continuously can be reliably wound around the winding shaft.

Preferably, in the thin plate-shaped single-crystal production equipment of the present invention,
portions of the thin plate-shaped seed single crystal to which the thin lines are attached each have a thickness equal to or less than a thickness of the thin plate-shaped single crystal to be produced.

When the thickness of the portions of the thin plate-shaped seed single crystal to which the thin lines are attached is set to be equal to or less than the thickness of the thin plate-shaped single crystal to be produced as described above, breakage of the thin plate-shaped single crystal that may occur when the surface of the thin plate-shaped single crystal comes into contact with the thin lines during winding of the thin plate-shaped single crystal around the winding shaft can be reliably prevented.

The thin plate-shaped single-crystal production equipment of the present invention is also characterized in that
a required amount of a liquid phase composition that coexists in equilibrium with a chemical composition of the thin plate-shaped single crystal to be produced is disposed on the upper surface of the raw material lump for the production of the thin plate-shaped single crystal at the beginning of the production.

By disposing the required amount of the liquid phase composition that coexists in equilibrium with the chemical composition of the thin plate-shaped single crystal to be produced on the upper surface of the raw material lump from the beginning as described above, the thin plate-shaped single crystal produced continuously can have a uniform optimum chemical composition.

The thin plate-shaped single-crystal production equipment of the present invention is also characterized by further including a vibration prevention member that is disposed between the elevator apparatus and the raw material lump for the production of the thin plate-shaped single crystal and prevents vibrations of the thin plate-shaped single crystal to be produced continuously.

When the vibration prevention member is disposed as described above, the thin plate-shaped single crystal produced is prevented from vibrating excessively in left and right directions. Therefore, the thin plate-shaped single crystal can stay within a prescribed range without displacement of the growth position, and the high-quality thin plate-shaped single crystal can be produced continuously and stably.

Preferably, the thin plate-shaped single-crystal production equipment of the present invention further includes
a blocking member that is disposed between the elevator apparatus and the raw material lump for the production of the thin plate-shaped single crystal and blocks radiant heat emitted from the melt such that the radiant heat is obstructed from reaching the thin plate-shaped single crystal to be produced continuously.

The thin plate-shaped single crystal is solidified while pulled up from the melt. When the radiant heat emitted from the melt reaches the thin plate-shaped single crystal produced, it is difficult to increase the production rate of the thin plate-shaped single crystal. Therefore, by disposing the blocking member, the radiant heat from the melt is obstructed from reaching the thin plate-shaped single crystal produced, and the efficiency of production of the thin plate-shaped single crystal can be increased.

The thin plate-shaped single-crystal production equipment of the present invention is also characterized in that
the raw material lump for the production of the thin plate-shaped single crystal has a substantially cuboidal shape.

When the raw material lump has such a shape, the melt (melt pool) can be continuously provided on the upper surface of the raw material lump by irradiation with the infrared ray.

The thin plate-shaped single-crystal production equipment of the present invention is also characterized in that
dimensions of the upper surface of the raw material lump for the production of the thin plate-shaped single crystal are set to be larger by several millimeters or more than dimensions of the lower surface of the thin plate-shaped seed single crystal in both a thickness direction and a transverse direction.

When the dimensions of the raw material lump and the dimensions of the thin plate-shaped seed single crystal are set as described above, the entire lower surface of the thin plate-shaped seed single crystal can be immersed in the melt, and a thin plate-shaped single crystal having a desired size can be produced continuously.

The thin plate-shaped single-crystal production equipment of the present invention is also characterized by further including:
a placement table on which the raw material lump for the production of the thin plate-shaped single crystal is to be placed; and
a position control apparatus that controls a position of the placement table such that the placement table is positioned at a prescribed position.

When the position (particularly the vertical position) of the placement table can be controlled as described above, even when the liquid level of the melt on the raw material lump is lowered when the thin plate-shaped single crystal is pulled up, the position of the raw material lump can be raised such that the original position is maintained, so that the liquid level can be controlled so as to be positioned always at the same position. Therefore, the irradiation position of the infrared ray can be always fixed to the same position, and the thin plate-shaped single crystal can be produced continuously and stably with high yield.

When the upper surface of the raw material lump is irradiated with a collimated laser beam from a direction perpendicular to the upper surface, the irradiation intensity of the laser beam is unchanged even when the liquid level of the melt on the raw material lump is lowered, and therefore it is unnecessary to control the liquid level of the melt on the raw material lump such that the liquid level is maintained constant.

The thin plate-shaped single-crystal production equipment of the present invention is also characterized in that
the elevator apparatus is configured such that the lower surface of the thin plate-shaped seed single crystal is immersed in a central portion of the melt on the upper surface of the raw material lump for the production of the thin plate-shaped single crystal, the melt being melted using the infrared ray irradiation apparatus.

The central portion of the melt is a portion in which the melt is steadily pooled. By immersing the lower surface of the thin plate-shaped seed single crystal in the central portion, the thin plate-shaped single crystal can be produced continuously by pulling the thin plate-shaped seed single crystal upward using the elevator apparatus.

The thin plate-shaped single-crystal production equipment of the present invention is also characterized by further including
a preheating apparatus that is disposed around the raw material lump for the production of the thin plate-shaped single crystal and preheats the raw material lump for the production of the thin plate-shaped single crystal in advance.

By preheating the raw material lump to a temperature near its melting point as described above, the amount of irradiation with the infrared ray using the infrared ray irradiation apparatus can be reduced. In this case, by increasing the adjustment accuracy at the same time, the range of the melt pool can be finely controlled. Therefore, the thin plate-shaped single crystal can be continuously produced stably with high precision.

Preferably, in the thin plate-shaped single-crystal production equipment of the present invention, at least the raw material lump for the production of the thin plate-shaped single crystal is disposed in a chamber, and
the elevator apparatus is disposed on an upper portion of the chamber.

When the raw material lump is disposed in the chamber, the thin plate-shaped single crystal can be produced in an atmosphere suitable for the single crystal material.

The thin plate-shaped single-crystal production equipment of the present invention is also characterized by further including
a gas introduction device that fills the chamber with an atmosphere gas containing a dopant.

When the gas introduction device is provided as described above, an atmosphere suitable for the characteristics of the material of the thin plate-shaped single crystal to be produced can be introduced into the chamber, and a high-quality thin plate-shaped single crystal having a uniform dopant concentration at an optimum chemical composition can be produced.

The thin plate-shaped single-crystal production equipment of the present invention is also characterized in that
a plurality of the elevator apparatuses is disposed above the raw material lump for the production of the thin plate-shaped single crystal.

In the above structure, for example, a plurality of thin plate-shaped seed single crystals may be immersed in one melt pool and then pulled upward using the respective elevator apparatuses. In this case, the efficiency of production of the thin plate-shaped single crystals can be significantly higher than that when one elevator apparatus is used.

In the thin plate-shaped single-crystal production equipment of the present invention, the thin plate-shaped seed single crystal has a thickness in a range of preferably 300 μm to 500 μm.

When the thickness is in the above range, the high-purity thin plate-shaped single crystal produced continuously can be wound and can have a large length.

In the thin plate-shaped single-crystal production equipment of the present invention, the thin plate-shaped single crystal has a thickness in the range of, preferably 100 μm to 3000 μm.

The thickness of the thin plate-shaped single crystal produced can be in the range of 100 μm to 3000 μm. When the winding apparatus is assumed to be used for winding, the thickness is preferably in the range of 100 μm to 500 μm. However, the thickness can be adjusted to less than 100 μm or more than 500 μm by controlling the temperature of the melt and the pulling rate.

When the thin plate-shaped single crystal is thicker than 500 μm, the diameter of the roll produced by winding the thin plate-shaped single crystal around the winding shaft of the winding apparatus is large. In this case, the thin plate-shaped single crystal may not be wound but may be pulled upward to form a product. In particular, when a silicon thin plate-shaped single crystal for solar batteries is produced, the thickness of the thin plate-shaped single crystal is in the range of preferably 200 μm to 400 μm.

The thin plate-shaped single-crystal production method of the present invention includes at least:
a melting step of melting an upper surface of a raw material lump for production of a thin plate-shaped single crystal by irradiating the upper surface of the raw material lump for the production of the thin plate-shaped single crystal with an infrared ray using an infrared ray irradiation apparatus;
a growing step of starting growth of a single crystal from a lower surface of a thin plate-shaped seed single crystal by immersing the lower surface of the thin plate-shaped seed single crystal in a melt using an elevator apparatus, the melt being formed on the upper surface of the raw material lump for the production of the thin plate-shaped single crystal in the melting step; and
a continuous production step of continuously producing the thin plate-shaped single crystal by pulling upward the thin plate-shaped seed single crystal from which the growth of the single crystal has been started in the growing step.

With the above production method, a thin plate-shaped single crystal having a uniform dopant concentration at an optimum chemical composition and having a thickness of several hundreds of micrometers can be continuously produced at low cost with high precision.

The thin plate-shaped single-crystal production method of the present invention is characterized in that,
in the melting step,
the infrared ray emitted from the infrared ray irradiation apparatus is a laser beam.

When the infrared ray is the laser beam, a prescribed area of the raw material lump that has a desired shape can be heated precisely. Therefore, the melt can be formed continuously in a reliable manner without spilling of the melt from the upper surface of the raw material lump.

The thin plate-shaped single-crystal production method of the present invention is characterized in that:
in the melting step,
a shape of an irradiation area irradiated with the laser beam is a hollow quadrangular shape elongated in a horizontal direction; and
a circumferential area of the upper surface of the raw material lump for the production of the thin plate-shaped single crystal is irradiated with the laser beam such that the hollow quadrangular irradiation area is formed in the circumferential area of the upper surface, the circumferential area excluding a central portion of the upper surface.

By irradiating the circumferential area, excluding the central portion, of the upper surface of the raw material lump with the laser beam such that the laser beam is fitted in the circumferential area and that the hollow quadrangular irradiation area is formed in the circumferential area, the circumferential area, excluding the central portion, of the upper surface of the raw material lump is first melted, and the central portion not irradiated with the laser beam is melted by heat transferred from the melt in the circumferential area melted first.

Therefore, the temperature of the central portion can be controlled so as to be lower than the temperature of the circumferential area. This allows contradictory actions, i.e., melting of the raw material lump and solidification from the melt, to be continued stably in a well-controllable manner.

Specifically, by forming the above temperature distribution in the melt pool on the upper surface of the raw material lump, the thin plate-shaped single crystal can be continuously grown from the central portion stably.

The upper surface of the raw material lump may be irradiated with the laser beam obliquely from above or vertically from above. It is preferable that the irradiation angle is adjusted to an optimum angle according to the thermal conductivity and thickness of the material of the thin plate-shaped single crystal. When a material having a high thermal conductivity is used, it is preferable that the irradiation angle of the laser beam is controlled such that the angle with respect to the horizontal direction is increased. When a material having a low thermal conductivity is used, it is preferable that the irradiation angle of the laser beam is controlled such that the angle with respect to the horizontal direction is reduced.

The thin plate-shaped single-crystal production method of the present invention is characterized by further including a winding step of, after the continuous production step, winding the thin plate-shaped single crystal produced continuously into a roll.

When the thin plate-shaped single-crystal production method includes the winding step, the thin plate-shaped single crystal produced continuously can be reliably wound into a roll, and the thin plate-shaped single crystal can be produced efficiently.

The thin plate-shaped single-crystal production method of the present invention is also characterized in that,
in the melting step,
when the thin plate-shaped single crystal to be produced is an incongruent melting material, a required amount of a liquid phase composition (the liquid phase is referred to as a solvent phase) that coexists in equilibrium with a chemical composition of the thin plate-shaped single crystal is disposed on the upper surface of the raw material lump for the production of the thin plate-shaped single crystal at the beginning of the production.

The thin plate-shaped single-crystal production method of the present invention is also characterized in that,
in the melting step,
when the thin plate-shaped single crystal to be produced is a solid solution material containing a dopant, a required amount of a liquid phase composition (the liquid phase is referred to as a solvent phase) that coexists in equilibrium with a chemical composition of the thin plate-shaped single crystal is disposed on the upper surface of the raw material lump for the production of the thin plate-shaped single crystal at the beginning of the production.

In these cases, when the thin plate-shaped single crystal is solidified from the solvent phase first formed on the upper surface of the raw material lump, the amount of the solvent phase decreases, and the amount of the crystal component in the chemical composition decreases. Therefore, the intensity of the laser beam that reaches a portion below the solvent phase increases, and its temperature increases, so that the melting of the raw material lump is facilitated.

In this case, crystallization and the melting of the raw material lump proceed simultaneously, and therefore the dopant concentration in the product obtained (the thin plate-shaped single crystal) is the same as the dopant concentration in the raw material lump and is uniform. This scheme is referred to as a "traveling solvent method" and is an only means that allows a single crystal product having a uniform chemical composition to be produced using a melt method.

By disposing the required amount of the liquid phase composition that coexists in equilibrium with the chemical composition of the thin plate-shaped single crystal to be produced on the upper surface of the raw material lump at the beginning as described above, the thin plate-shaped single crystal produced continuously can have a uniform optimum chemical composition.

The thin plate-shaped single-crystal production method of the present invention is also characterized in that,
in the growing step,
the lower surface of the thin plate-shaped seed single crystal is immersed in a central portion of the melt formed on the upper surface of the raw material lump for the production of the thin plate-shaped single crystal.

The central portion of the melt is a portion in which the melt is steadily pooled. By immersing the lower surface of the thin plate-shaped seed single crystal in the central portion, the thin plate-shaped single crystal can be produced continuously by pulling the thin plate-shaped seed single crystal upward using the elevator apparatus.

Advantageous Effects of Invention

In the thin plate-shaped single-crystal production equipment of the invention and the thin plate-shaped single-crystal production method of the invention, the upper surface of the raw material lump for the production of the thin plate-shaped single crystal is melted by the infrared ray to form a melt, and the thin plate-shaped seed single crystal is immersed in the melt and then pulled upward. In this manner, a thin plate-shaped single crystal having a uniform dopant concentration at an optimum chemical composition and having a thickness of several hundreds of micrometers can be continuously produced at low cost with high precision.

BRIEF DESCRIPTION OF DRAWINGS

FIG. 1 is a schematic illustration of a thin plate-shaped single-crystal production equipment in a first embodiment of the present invention.

FIG. 2 is an illustration showing the shape of an irradiation area irradiated with a laser beam emitted from an infrared ray irradiation apparatus.

FIG. 3 is a conceptual illustration when a raw material lump for the production of the thin plate-shaped single crystal is viewed from an upper surface side in the thin plate-shaped single-crystal production equipment.

FIG. 4 is another schematic illustration of the thin plate-shaped single-crystal production equipment in the first embodiment of the present invention.

FIG. 5 is an illustration for explaining the state of a melt (melt pool) formed on the upper surface of the raw material lump for the production of the thin plate-shaped single crystal in the thin plate-shaped single-crystal production equipment shown in FIG. 1.

FIG. 6 is an illustration for explaining the state of a melt (melt pool) formed on the upper surface of the raw material lump for the production of the thin plate-shaped single crystal in the thin plate-shaped single-crystal production equipment shown in FIG. 4.

FIG. 7 is a schematic perspective view for explaining the state of the raw material lump for the production of the thin plate-shaped single crystal, the thin plate-shaped seed single crystal and the thin plate-shaped single crystal.

FIG. 8 is a schematic illustration of a thin plate-shaped single-crystal production equipment in a second embodiment of the present invention.

FIG. 9 is a schematic illustration of another thin plate-shaped single-crystal production equipment in the second embodiment of the present invention.

FIG. 10 is a schematic illustration of a thin plate-shaped single-crystal production equipment in a third embodiment of the present invention.

FIG. 11 is an enlarged illustration of a main part of the thin plate-shaped single-crystal production equipment shown in FIG. 10.

FIG. 12 shows schematic illustrations of steps in the thin plate-shaped single-crystal production method of the present invention.

FIG. 13 shows schematic illustrations of steps in the thin plate-shaped single-crystal production method of the present invention.

DESCRIPTION OF EMBODIMENTS

The thin plate-shaped single-crystal production equipment of the invention and the thin plate-shaped single-crystal production method of the invention will be described in more detail based on the drawings.

The thin plate-shaped single-crystal production equipment of the invention and the thin plate-shaped single-crystal production method of the invention are used to produce a thin plate-shaped single crystal having a uniform dopant concentration at an optimum chemical composition and having a thickness of several hundreds of micrometers continuously at low cost with high precision.

<Thin Plate-Shaped Single-Crystal Production Equipment 10>

First Embodiment

As shown in FIG. 1, in a thin plate-shaped single-crystal production equipment 10 in a first embodiment of the present invention, a raw material lump for the production of the thin plate-shaped single crystal (hereinafter referred to also as a raw material lump) 12 is placed on a placement table 82 disposed in a lower portion of a chamber 80. The raw material lump 12 has a substantially cuboidal shape and is, for example, a plate-shaped body such as a book.

Infrared ray irradiation apparatuses 20 are provided beside an upper portion of the chamber 80 and irradiate an upper surface 14 of the substantially cuboidal raw material lump 12 with respective infrared rays 16 to melt the upper surface 14.

Preferably, the infrared rays 16 emitted from the infrared ray irradiation apparatuses 20 are each a laser beam 16a.

Specifically, as shown in FIG. 2, the shape of the irradiation area irradiated with the laser beams 16a is a hollow quadrangular shape elongated in a horizontal direction (the vertical direction in FIG. 2). As shown in FIG. 3, it is preferable that the upper surface 14 of the raw material lump 12 is irradiated with the laser beams 16a such that the hollow quadrangular irradiation area elongated in the horizontal direction is formed in a circumferential area of the upper surface 14 of the raw material lump 12 so as to be fitted in the circumferential area, the circumferential area of the upper surface 14 excluding its central portion.

Preferably, the laser beams 16a emitted from the infrared ray irradiation apparatuses 20 enter the chamber 80 through windows 22 provided in side portions of the chamber 80 and are incident on the circumferential area, excluding the central portion, of the upper surface 14 of the raw material lump 12 through reflectors 24 in the chamber 80. In this case, the upper surface 14 of the raw material lump 12 may be irradiated with the laser beams 16a obliquely from above as shown in FIG. 1, or the upper surface 14 of the raw material lump 12 may be irradiated with the laser beams 16a vertically from above as shown in FIG. 4. The irradiation angle is adjusted to an optimum angle according to the thermal conductivity of the single crystal material, the thickness of a thin plate-shaped single crystal 40 to be produced, etc.

In this manner, the circumferential area, excluding the central portion, of the upper surface 14 of the raw material lump 12 melts before the central portion melts, and the central portion not irradiated with the laser beams 16a is melted by heat transferred from a melt 18 in the circumferential area melted first.

Therefore, the temperature of the central portion is controlled so as to be lower than the temperature of the circumferential area. When the melt 18 (melt pool) on the upper surface 14 of the raw material lump 12 has the above temperature distribution, the thin plate-shaped single crystal 40 can be grown from the central portion stably and continuously.

Specifically, by irradiating the circumferential area, excluding the central portion, of the upper surface 14 of the raw material lump 12 with the laser beams 16a as shown in FIGS. 5 and 6, the melt 18 formed in the circumferential area extends to a larger depth, and the melt 18 formed in the central portion has a lower temperature than in the circumferential area and extends to a smaller depth.

As shown in FIGS. 1, 3, and 4, a preheating apparatus 70 that preheats the raw material lump 12 is disposed around the raw material lump 12. Preferably, the raw material lump 12 is preheated to a temperature near its melting point before the upper surface 14 of the raw material lump 12 is melted using the infrared ray irradiation apparatuses 20. By preheating the raw material lump 12 as described above, the amount of irradiation with the infrared rays 16 using the infrared ray irradiation apparatuses 20 can be significantly reduced, and the range of the melt 18 (melt pool) can be finely adjusted by finely controlling the positions and the amount of irradiation.

An elevator apparatus 30 is disposed on an upper portion of the chamber 80. The elevator apparatus 30 causes a lower surface 34 of a thin plate-shaped seed single crystal 32 to be immersed in the melt 18 melted using the infrared ray irradiation apparatuses 20 and formed on the upper surface 14 of the raw material lump 12 and then pulls the immersed thin plate-shaped seed single crystal 32 upward.

No particular limitation is imposed on the elevator apparatus 30. Preferably, the elevator apparatus 30 is, for example, a winding apparatus 50 that continuously winds the produced thin plate-shaped single crystal 40 into a roll. The winding apparatus 50 has a specific structure including a winding shaft 36 that continuously winds the thin plate-shaped single crystal 40 produced and a rotating apparatus 38 that rotates the winding shaft 36.

The dimensions of the lower surface 34 of the thin plate-shaped seed single crystal 32 are set to be smaller than the dimensions of the upper surface 14 of the raw material lump 12. A specific example of the relation between their dimensions is as follows. The dimensions of the upper surface 14 of the raw material lump 12 are set to be larger by several mm or more than the dimensions of the lower surface 34 of the thin plate-shaped seed single crystal 32 in both the thickness and transverse directions. Specifically, their dimensions are set such that the entire lower surface 34 of the thin plate-shaped seed single crystal 32 can be immersed in the melt 18.

Then, as shown in FIG. 7, the elevator apparatus 30 is used to immerse the lower surface 34 of the thin plate-shaped seed single crystal 32 in the central portion of the melt 18 formed on the upper surface 14 of the raw material lump 12 using the infrared ray irradiation apparatuses 20. The growth of a single crystal is thereby started from the immersed lower surface 34 of the thin plate-shaped seed single crystal 32. Then the elevator apparatus 30 is used to pull the thin plate-shaped seed single crystal 32 upward, and the thin plate-shaped single crystal 40 is thereby produced continuously.

The thickness of the produced thin plate-shaped single crystal 40 in a steady state can be controlled by adjusting the temperature of the melt, the pulling rate of the thin plate-shaped seed single crystal 32, etc. and can be adjusted to, for example, 100 µm to 3000 µm or more. However, when the thickness of the thin plate-shaped single crystal 40 exceeds 500 µm, a large winding apparatus 50 must be used. Therefore, when the thickness exceeds 500 µm, the thin plate-shaped single crystal 40 may not be wound and may be pulled upward to form a product. In particular, when a silicon thin plate-shaped single crystal for solar batteries is produced, the thickness of the thin plate-shaped single crystal 40 is preferably in the range of 200 µm to 400 µm.

There is a correlation between the temperature of the melt and the pulling rate. Specifically, when the temperature of the melt is high, the amount of cooling necessary for the growth of the thin plate-shaped single crystal 40 is large, so that the pulling rate is reduced. When the temperature of the melt is low, the efficiency of production of the thin plate-shaped single crystal 40 can be increased by increasing the pulling rate of the thin plate-shaped single crystal 40. However, if the pulling rate is excessively high, so-called "cellular growth" is likely to occur, and the crystal characteristics of the thin plate-shaped single crystal 40 deteriorate. It is therefore preferable to control the pulling rate appropriately.

The thickness of the thin plate-shaped seed single crystal 32 immersed in the melt 18 may be, for example, about 300 µm to 500 µm. It is preferable that the thin plate-shaped seed single crystal 32 has such a thickness because a thin plate-shaped single crystal 40 having a desired thickness can be continuously produced by controlling the temperature of the melt and the pulling rate.

In FIGS. 1 and 4, the thickness of the illustrated thin plate-shaped single crystal 40 and the thickness of the illustrated thin plate-shaped seed single crystal 32 differ from each other. This is for the purpose of distinguishing the thin plate-shaped single crystal 40 and the thin plate-shaped seed single crystal 32 from each other in the illustrations and is not intended to limit the relation between their thicknesses.

Preferably, the thin plate-shaped seed single crystal 32 is suspended from the winding shaft 36 of the winding apparatus 50 through a plurality of heat-resistant high-strength fine lines 52 (three fine lines in FIG. 7). In particular, when the thickness of portions of the thin plate-shaped seed single crystal 32 to which the fine lines 52 are attached is equal to or less than the thickness of the thin plate-shaped seed single crystal 32, breakage of the thin plate-shaped single crystal 40 that may occur when the surface of the thin plate-shaped single crystal 40 comes into contact with the fine lines 52 during winding of the thin plate-shaped single crystal 40 around the winding shaft 36 can be reliably prevented.

No particular limitation is imposed on the method for attaching the fine lines 52 to the thin plate-shaped seed single crystal 32. For example, the following method may be used. Several through holes for tying the fine lines 52 are formed in an edge portion of the thin plate-shaped seed single crystal 32, and recessed grooves are formed on both sides of the thin plate-shaped seed single crystal 32 so as to be connected to the through holes. In this manner, when the fine lines 52 are tied to the thin plate-shaped seed single crystal 32, the fine lines 52 are fitted into the recessed grooves, and therefore the fine lines 52 do not protrude outward from the thin plate-shaped seed single crystal 32. In this manner, breakage of the thin plate-shaped single crystal 40 that may occur when the surface of the thin plate-shaped single crystal 40 comes into contact with the fine lines 52 during winding of the thin plate-shaped single crystal 40 around the winding shaft 36 can be reliably prevented.

In the thin plate-shaped single-crystal production equipment 10, it is preferable that a vibration prevention member 60 and a blocking member 62 are disposed between the elevator apparatus 30 and the raw material lump 12. The vibration prevention member 60 prevents vibrations of the thin plate-shaped single crystal 40 produced continuously so that the growth position is not displaced and falls within a prescribed range. The blocking member 62 blocks radiant heat emitted from the melt 18 such that the radiant heat is obstructed from reaching the thin plate-shaped single crystal 40 produced continuously.

By disposing the vibration prevention member 60, the thin plate-shaped single crystal 40 produced is prevented from vibrating excessively in left and right directions, and the displacement of the growth position can be prevented, so that the high-quality thin plate-shaped single crystal 40 can be produced continuously.

By disposing the blocking member 62, the rate of the production of the thin plate-shaped single crystal 40 can be increased. Specifically, a method including melting a raw material and solidifying the molten raw material as a single crystal is referred to as a melt method. The growth rate of the single crystal in the melt method can be increased by efficiently dissipating latent heat of crystallization emitted during solidification of the crystal through heat transfer through the single crystal in contact with the melt.

Therefore, by disposing the blocking member 62 such that, for example, the optical paths of the infrared rays 16 (the laser beams 16a) are not blocked, the amount of the radiant heat reaching the thin plate-shaped single crystal 40 can be reduced. This can prevent the temperature of the thin plate-shaped single crystal 40 from increasing, so that the latent heat of crystallization can be efficiently dissipated. Therefore, the efficiency of production of the thin plate-shaped single crystal 40 can be increased.

As described above, by using the thin plate-shaped single-crystal production equipment 10, the thin plate-shaped single crystal 40 can be produced continuously. However, during the continuous production of the thin plate-shaped single crystal 40, the amount of the melt 18 formed on the upper surface 14 of the raw material lump 12 decreases, and the position of the upper surface 14 is lowered. When the position of the upper surface 14 is lowered, it is necessary to control the irradiation position irradiated with the infrared rays from the infrared ray irradiation apparatuses 20 such that the irradiation position is adjusted to a desired position.

In the present embodiment, instead of controlling the irradiation position irradiated with the infrared rays 16, a position control apparatus 84 that controls the vertical position of the placement table 82 is provided in the placement table 82 on which the raw material lump 12 is to be placed.

When the position control apparatus 84 is provided as described above, even when the position of the melt 18 on the upper surface 14 of the raw material lump 12 is lowered as the thin plate-shaped single crystal 40 produced continuously is pulled upward, the placement table 82 is raised such that the position of the melt 18 on the upper surface 14 of the raw material lump 12 is maintained at the initial position, so that the liquid level of the melt 18 can be maintained at the same position.

It is therefore only necessary to cause the infrared rays 16 to be incident always on the same positions, and the thin plate-shaped single crystal 40 can be produced stably and continuously at high yield. When the upper surface 14 of the raw material lump 12 is irradiated with the laser beams 16a vertically from immediately above the raw material lump 12 as in the thin plate-shaped single-crystal production equipment 10 shown in FIGS. 4 and 6, the temperature of the melt 18 is unchanged even when the position of the upper surface 14 of the raw material lump 12 varies. It is therefore unnecessary to control the position of the upper surface 14 of the raw material lump 12.

The raw material lump 12 used for the above-described thin plate-shaped single-crystal production equipment 10 has the chemical composition of the material of the thin plate-shaped single crystal 40 to be produced. However, the material of the thin plate-shaped single crystal 40 may be an incongruent melting material. In this case, even when this raw material lump 12 itself is melted and solidified in the thin plate-shaped single-crystal production equipment 10, a target thin plate-shaped single crystal 40 cannot be obtained.

Therefore, a liquid phase amount of a liquid phase composition that coexists in equilibrium with the chemical composition of the material of the thin plate-shaped single crystal 40 to be produced is placed on the upper surface 14 of the raw material lump 12 and is first melted. In this case, the molten solvent is placed on the upper surface 14 of the raw material lump 12.

When the thin plate-shaped single crystal 40 is produced after the placement of the liquid phase composition, the amount of the raw material lump 12 melted is the same as the amount of the solidified single crystal, so that the amount and chemical composition of the solvent are unchanged from the beginning to the end. It appears as if the solvent phase dissolves the raw material lump 12 and moves while the single crystal is precipitated.

This scheme is referred to as the "traveling solvent method." When the thin plate-shaped single crystal 40 obtained using the thin plate-shaped single-crystal production equipment 10 is an incongruent melting material or a solid solution material containing a dopant, it is important to use the "traveling solvent method" in order to make the dopant concentration in the obtained thin plate-shaped single crystal 40 constant.

Second Embodiment

Next, a second embodiment of the thin plate-shaped single-crystal production equipment 10 of the present invention will be described.

FIGS. 8 and 9 show the thin plate-shaped single-crystal production equipment 10 in the second embodiment of the present invention.

The thin plate-shaped single-crystal production equipment 10 shown in FIGS. 8 and 9 have basically the same structure as the thin plate-shaped single-crystal production equipment 10 in the first embodiment shown in FIGS. 1 to 7, and the same components are denoted by the same reference numerals. Their detailed description will be omitted, and differences will be described.

As shown in FIGS. 8 and 9, the thin plate-shaped single-crystal production equipment 10 in the second embodiment of the present invention differ from the thin plate-shaped single-crystal production equipment 10 in the first embodiment in that a gas introduction device 90 that fills the chamber 80 with an atmosphere gas containing a dopant is provided for the chamber 80.

The gas introduction device 90 is disposed beside an upper side portion of the chamber 80 and configured to introduce the atmosphere gas from the gas introduction device 90 through an introduction pipe 92 to the chamber 80. A discharge pipe 94 is disposed in a lower side portion of the chamber 80, and the atmosphere gas can be discharged from the discharge pipe 94 to the outside of the chamber 80.

In this case, a state in which the chamber 80 is filled with the atmosphere gas suitable for the production of the thin plate-shaped single crystal 40 can be maintained, and a high-quality thin plate-shaped single crystal 40 having a uniform dopant concentration can be produced continuously.

The atmosphere gas may be prepared according to the characteristics of the material of the thin plate-shaped single crystal 40 to be produced. For example, when an N-type silicon thin plate-shaped single crystal is produced, it is preferable to introduce, as the atmosphere gas, high-purity argon gas containing phosphine ($PH_3$) at an optimum concentration into the chamber 80.

As shown in FIG. 9, for example, the windows 22 for introducing the infrared rays 16 (the laser beams 16*a*) emitted from the infrared ray irradiation apparatuses 20 into the chamber 80, the reflectors 24 for guiding the infrared rays 16 (the laser beams 16*a*) introduced into the chamber 80 to the upper surface 14 of the raw material lump 12, etc. may be covered with a cover member 42, and the atmosphere gas may be allowed to be actively introduced from the gas introduction device 90 into the cover member 42.

As described above, by introducing the atmosphere gas into the cover member 42, adhesion of evaporated substances generated from the melt 18 to the windows 22, the reflectors 24, etc. can be prevented, and a high-quality thin plate-shaped single crystal 40 having a uniform dopant concentration can be produced stably and continuously at high yield.

Third Embodiment

Next, a third embodiment of the thin plate-shaped single-crystal production equipment 10 of the present invention will be described.

FIGS. 10 and 11 show the thin plate-shaped single-crystal production equipment 10 in the third embodiment of the present invention.

The thin plate-shaped single-crystal production equipment 10 shown in FIGS. 10 and 11 has basically the same structure as the thin plate-shaped single-crystal production equipment 10 in the first embodiment shown in FIGS. 1 to 7, and the same components are denoted by the same reference numerals. Their detailed description will be omitted, and differences will be described.

As shown in FIGS. 10 and 11, the thin plate-shaped single-crystal production equipment 10 in the third embodiment of the present invention differs from the thin plate-shaped single-crystal production equipment 10 in the first embodiment in that a plurality of the elevator apparatuses 30 (two elevator apparatuses 30 in FIG. 10) are disposed above the raw material lump 12.

Specifically, the two elevator apparatuses 30 (winding apparatuses 50) are arranged in the left-right direction on an upper portion of the chamber 80. Thin plate-shaped seed single crystals 32, 32 are immersed in the melt 18 on the upper surface 14 of the raw material lump 12 and pulled upward using the respective elevator apparatuses 30, 30 (winding apparatuses 50, 50), and thin plate-shaped single crystals 40, 40 can thereby be produced.

When the plurality of elevator apparatuses 30 are disposed above the raw material lump 12 as described above, the efficiency of the production of the thin plate-shaped single crystals 40 can be significantly higher than that when one elevator apparatus 30 is used.

<Thin Plate-Shaped Single-Crystal Production Method>

Next, a thin plate-shaped single-crystal production method using the thin plate-shaped single-crystal production equipment 10 of the present invention will be described.

First, as shown in FIG. 12(*a*), the raw material lump 12 is placed on the placement table 82 in the chamber 80, and the chamber 80 is sealed. Then the thin plate-shaped seed single crystal 32 is disposed above the upper surface of the raw material lump 12 such that the lengthwise direction of the raw material lump 12 coincides with the extending direction of the thin plate-shaped seed single crystal 32. The thin plate-shaped seed single crystal 32 is suspended from the winding shaft 36 of the winding apparatus 50 using the fine lines 52.

The chamber 80 is evacuated through a discharge pipe (not shown), and an atmosphere gas suitable for the characteristics of the material of the thin plate-shaped single crystal 40 to be produced is introduced into the chamber 80 using a gas introduction device (not shown).

Next, the preheating apparatus 70 is used to increase the temperature of the raw material lump 12 to a temperature close to its melting point. Next, as shown in FIG. 12(*b*), the infrared ray irradiation apparatuses 20 are used to irradiate the upper surface 14 of the raw material lump 12 with the infrared rays 16 (the laser beams 16*a*) to melt the upper surface 14.

The irradiation area irradiated with the infrared rays 16 (the laser beams 16*a*) has a hollow quadrangular shape elongated in the horizontal direction, and the circumferential area, excluding the central portion, of the upper surface 14 of the raw material lump 12 is irradiated with the laser beams 16*a* such that the hollow quadrangular irradiation area elongated in the horizontal direction is formed in the circumferential area so as to be fitted in the circumferential area.

In this manner, the circumferential area, excluding the central portion, of the upper surface 14 of the raw material lump 12 melts before the central portion melts, and the central portion not irradiated with the laser beams 16*a* is melted by heat transferred from the melt 18 in the circumferential area melted first.

Next, as shown in FIG. 12(*c*), the lower surface 34 of the thin plate-shaped seed single crystal 32 is immersed in the central portion of the melt 18 formed on the upper surface 14 of the raw material lump 12 using the elevator apparatus 30 (the winding apparatus 50) to start the growth of a single crystal from the lower surface 34 of the thin plate-shaped seed single crystal 32.

Next, as shown in FIG. 13(*a*), the elevator apparatus 30 (the winding apparatus 50) is used to pull the thin plate-shaped seed single crystal 32 upward to produce the thin plate-shaped single crystal 40 continuously.

Next, as shown in FIG. 13(*b*), while the thin plate-shaped single crystal 40 is produced continuously, the position of the placement table 82 is moved upward using the position control apparatus 84. In this manner, although the position of the melt 18 in the raw material lump 12 is lowered as the thin plate-shaped single crystal 40 is pulled up, the position of the raw material lump 12 is controlled such that the initial position is maintained, so that the liquid level of the melt 18 is maintained always at the same level.

When the upper surface 14 of the raw material lump 12 is irradiated with the laser beams 16*a* vertically from immediately above the raw material lump 12 as in the thin plate-shaped single-crystal production equipment 10 shown in FIGS. 4 and 6, the temperature of the melt 18 is unchanged even when the position of the upper surface 14 of the raw material lump 12 varies. It is therefore unnecessary to control the position of the upper surface 14 of the raw material lump 12 such that the position of the upper surface 14 is maintained at a given position.

Finally, as shown in FIG. 13(*c*), the amount of irradiation with the infrared rays 16 (the laser beams 16*a*) from the infrared ray irradiation apparatuses 20 is increased to increase the temperature of the melt 18 to thereby separate the thin plate-shaped single crystal 40 from the melt 18. Then the winding of the continuously produced thin plate-shaped single crystal 40 using the elevator apparatus 30 (the winding apparatus 50) is stopped, and the irradiation with the infrared rays 16 (the laser beams 16a) using the infrared ray irradiation apparatuses 20 is stopped. The production of the thin plate-shaped single crystal 40 is thereby completed.

EXAMPLE

Example 1

The thin plate-shaped single-crystal production equipment 10 of the present invention was used to produce an N-type silicon thin plate-shaped single crystal 40 doped with phosphorus.

The raw material lump 12 used was a cuboidal raw material lump 12 having a width of 400 mm, a thickness of 50 mm, and a height of 500 mm.

The thin plate-shaped seed single crystal 32 used was a silicon thin plate-shaped seed single crystal 32 having a (111) plane, a width of 350 mm, a thickness of 0.3 mm, and a height of 100 mm. One property of silicon is that flat surfaces called facets tend to appear in a (111) plane direction. The flat surfaces were used as plate surfaces of the thin plate-shaped seed single crystal 32. The thin plate-shaped seed single crystal 32 was attached to the winding shaft 36 of the winding apparatus 50 in advance using three fine lines 52.

First, the raw material lump 12 was placed on the placement table 82 in the chamber 80. Then the chamber 80 was closed, and the atmosphere inside the chamber 80 was brought to a vacuum state.

Next, an atmosphere gas was introduced into the chamber 80. The atmosphere gas used was high-purity argon gas, and the required amount of phosphine ($PH_3$) gas for addition of phosphorus was added to the atmosphere gas used.

The raw material lump 12 was first heated to a temperature close to its melting point using the preheating apparatus 70. After the raw material lump 12 had been heated, a circumferential area of the upper surface 14 of the raw material lump 12 excluding its central portion and its outermost circumferential portion was irradiated with laser beams having a width of 20 mm and a length of 396 mm from the left and right sides at an angle of 60° with respect to the horizontal with 2 mm margins from edges. Simultaneously, opposite lengthwise end portions of the raw material lump 12 that were on the centerline of the raw material lump 12 were irradiated with laser beams 16a each having a rectangular irradiation area shape having a width of 6 mm at an angle of 60° with respect to the horizontal with 2 mm margins from edges. The irradiation area has a hollow quadrangular overall shape elongated in the horizontal direction. The entire upper surface 14 was thereby melted.

The winding shaft 36 of the winding apparatus 50 was rotated to immerse the lower surface 34 of the silicon thin plate-shaped seed single crystal 32 in the central portion of the melt 18 obtained by melting. Then the rotation of the winding shaft 36 was reversed to pull the thin plate-shaped seed single crystal 32 upward while a thin plate-shaped single crystal 40 was grown from the lower surface 34 of the thin plate-shaped seed single crystal 32. The thin plate-shaped single crystal 40 was continuously wound into a roll around the winding shaft 36 disposed in an upper portion. The thin plate-shaped single crystal 40 produced was long and had a length of more than 10 m.

The thin plate-shaped seed single crystal 32 was attached to the winding shaft 36 of the winding apparatus 50 using the carbon fiber fine lines 52 having a diameter of about 0.05 mm. By controlling the rotation direction and rotation speed of the winding shaft 36 using the rotating apparatus 38, the thin plate-shaped seed single crystal 32 was moved vertically.

Immediately after the thin plate-shaped seed single crystal 32 had been immersed in the central portion of the melt 18, crystallization started. A portion of the thin plate-shaped seed single crystal 32 that was immersed in the melt 18 was increased in thickness. However, it was found that, when the thin plate-shaped seed single crystal 32 immersed in the melt 18 was left to stand, the thickened portion melted and was reduced in thickness.

The thin plate-shaped seed single crystal 32 in the above state was pulled upward, and the thickness of the thin plate-shaped single crystal 40 produced was checked using a camera. The pulling rate and the irradiation intensity of the laser beams 16a were controlled to adjust the thickness to 0.3 mm, and the winding shaft 36 was rotated to wind the thin plate-shaped single crystal 40 continuously around the winding shaft 36.

When the pulling rate of the thin plate-shaped seed single crystal 32 was reduced, the thickness of the thin plate-shaped single crystal 40 was found to increase. When the pulling rate was increased, the thickness of the thin plate-shaped single crystal 40 was found to decrease. The temperature of the melt was controlled such that the thin plate-shaped single crystal 40 having a thickness of 0.3 mm was continuously pulled upward at a rate of 30 mm per minute.

As the thin plate-shaped single crystal 40 was pulled upward, the liquid level of the melt 18 in the raw material lump 12 was lowered. Therefore, the position of the placement table 82 with the raw material lump 12 placed thereon was adjusted to the prescribed position using the position control apparatus 84 such that the initial position was maintained, so that the liquid level of the melt 18 in the raw material lump 12 was always at the initial level.

The thus-produced long thin plate-shaped single crystal 40 having a length of more than 10 m, a thickness of 0.3 mm, and a width of 383 to 386 mm was subjected to secondary ion mass spectrometry (SIMS). The concentration of phosphorus used as the dopant was found to be uniform at an optimum chemical composition, and the quality of the thin plate-shaped single crystal 40 was found to be high. Therefore, the superiority of the thin plate-shaped single-crystal production equipment 10 of the invention and the thin plate-shaped single-crystal production method of the invention was confirmed.

Next, the above-described thin plate-shaped single-crystal production equipment 10 of the invention and the thin plate-shaped single-crystal production method using the thin plate-shaped single-crystal production equipment 10 will be summarized.

The most significant factor that allows the thin plate-shaped single crystal 40 to be produced continuously and stably using the thin plate-shaped single-crystal production equipment 10 of the invention and the thin plate-shaped single-crystal production method of the invention is that the melting of the raw material lump 12 and the formation of the single crystal from the obtained melt 18 can be controlled substantially independently.

Specifically, heating is necessary to melt the raw material lump 12 to thereby obtain the melt 18, but cooling is necessary to solidify the melt 18 to thereby obtain a crystal. These actions are contradictory.

In the present invention, a portion to be crystallized (the central portion of the melt 18) is not directly irradiated with the laser beams 16a, and a portion excluding the portion to be crystallized (the circumferential area excluding the central portion of the melt 18) is irradiated with the laser beams 16a to melt the upper surface 14 of the raw material lump 12. The heat of the melt 18 transfers to the portion to be crystallized (the central portion of the melt 18), and the melt 18 is formed also in the central portion of the upper surface 14.

In this case, the temperature of the portion to be crystallized (the central portion of the melt 18) is lower than the temperature of the molten portion irradiated with the laser beams 16a (the circumferential area of the melt 18 excluding the central portion), and this facilitates crystallization.

When the thin plate-shaped seed single crystal 32 is immersed in the central portion of the melt 18, the heat of the melt 18 transfers to the immersed lower surface 34 of the thin plate-shaped seed single crystal 32. Therefore, the temperature of the melt in contact with the lower surface 34 decreases, and the crystallization proceeds abruptly. When the immersed lower surface 34 is left to stand for a while, the amount of the heat dissipating through the thin plate-shaped seed single crystal 32 is brought to a steady state. The abruptly solidified portion is gradually melted by the heat from the melt 18 therearound, and a steady state is thereby reached.

When the thin plate-shaped seed single crystal 32 in this state is pulled upward, the thin plate-shaped seed single crystal 32 moves to a low-temperature area, and crystallization proceeds on the lower surface 34 in contact with the melt 18.

When the pulling rate of the thin plate-shaped seed single crystal 32 is increased, the crystallization cannot keep up with the pulling. In this case, the thickness of the thin plate-shaped single crystal 40 produced decreases. When the pulling rate is reduced, the crystallization proceeds, and the thickness of the thin plate-shaped single crystal 40 increases.

When the temperature of the melt 18 is set to be lower, the crystallization is facilitated, and the thickness of the thin plate-shaped single crystal 40 increases. In this case, even when the pulling rate is increased, a thin plate-shaped single crystal 40 having a prescribed thickness can be produced continuously.

The efficiency of production of the thin plate-shaped single crystal 40 can be increased by increasing the pulling rate. However, when the pulling rate is increased excessively, the possibility of the occurrence of cellular growth increases. When the cellular growth occurs, large fluctuations in the concentration of phosphorus serving as the dopant occur locally, and the characteristics of the single crystal deteriorate. It is therefore important to produce the thin plate-shaped single crystal 40 continuously by increasing the pulling rate as much as possible while the occurrence of cellular growth is prevented.

The present invention is the first to allow a high-quality thin plate-shaped single crystal 40 having a uniform chemical composition to be produced even when a so-called non-congruent melting material such as an incongruent melting material or a solid solution single crystal is used. It has been thought that a thin plate-shaped single crystal 40 of a non-congruent melting material that has a uniform chemical composition cannot be produced using a conventional method.

Specifically, to produce a single crystal of a non-congruent melting material that has a uniform chemical composition using the so-called melt method including melting the raw material to form a melt and solidifying the melt to produce the single crystal, there is in principle no method other than the so-called traveling solvent method including producing a raw material lump 12 having a target chemical composition in advance and using a solvent having a solvent chemical composition that coexists in equilibrium with a material having the target chemical composition to cause the raw material lump 12 to melt and the single crystal to precipitate from the solvent simultaneously.

In the present invention, the required amount of a solvent phase component is placed on the upper surface 14 of the raw material lump 12, and then the upper surface 14 is irradiated with the infrared rays 16 to melt the solvent phase component to thereby form a solvent solution. The traveling solvent method is applied by allowing the production of a single crystal from the solvent and melting of the raw material lump 12 into the solvent to proceed simultaneously, and a thin plate-shaped single crystal 40 having a uniform chemical composition can thereby be produced.

The thin plate-shaped single-crystal production equipment 10 of the invention and the thin plate-shaped single-crystal production method using the thin plate-shaped single-crystal production equipment 10 have been described, but the present invention is not limited to the above embodiments.

For example, the first to third embodiments of the thin plate-shaped single-crystal production equipment 10 have been described separately. However, these may be combined and used as the thin plate-shaped single-crystal production equipment 10 of the invention. Specifically, for example, the thin plate-shaped single-crystal production equipment 10 may be a combination of the first embodiment and the second and third embodiments.

In the above examples of the thin plate-shaped single-crystal production equipment 10, the infrared ray irradiation apparatuses 20 are disposed such that the quadrangular shape can be irradiated with the laser beams parallel to the respective sides of the quadrangular shape, but this is not a limitation. Only one infrared ray irradiation apparatus 20 may be used.

The hollow quadrangular irradiation area elongated in the horizontal direction and fitted in the circumferential area, excluding the central portion, of the upper surface 14 of the raw material lump 12 may be formed using a plurality of laser beams 16a, so long as the irradiation area irradiated with the laser beams 16a can form the hollow elongated quadrangular irradiation area. No limitation is imposed on the number of infrared ray irradiation apparatuses 20 and the cross-sectional shape of the laser beam 16a emitted from one infrared ray irradiation apparatus 20.

Specifically, the upper surface 14 of the raw material lump 12 may be irradiated with laser beams 16a each having a square U-shaped cross section from left and right sides such that the two laser beams 16a, 16a having the square U-shaped cross section form the irradiation area having a hollow quadrangular cross-sectional shape elongated in the horizontal direction. Alternatively, four laser beams each having a rod-shaped cross-sectional shape may be used to form the hollow quadrangular irradiation area elongated in the horizontal direction.

In the above description, the thickness of the thin plate-shaped single crystal 40 produced is about 100 μm to about 3000 μm. However, a thin plate-shaped single crystal 40 having a thickness of 5000 μm or more can in principle be produced, and the thickness is not limited to the above range.

In the above description, the thickness of the thin plate-shaped seed single crystal 32 to be immersed in the melt 18 is, for example, about 300 μm to about 500 μm. In this case also, even when the thin plate-shaped seed single crystal 32 has a thickness outside the above range, a thin plate-shaped single crystal 40 can in principle be produced, and the thickness is not limited to the above range.

As described above, the thin plate-shaped single-crystal production equipment 10 of the invention and the thin plate-shaped single-crystal production method of the invention can be modified variously within the scope of the object of the invention.

REFERENCE SIGNS LIST

10 thin plate-shaped single-crystal production equipment
12 raw material lump for production of thin plate-shaped single crystal (raw material lump)
14 upper surface
16 infrared ray
16a laser beam
18 melt
20 infrared ray irradiation apparatus
22 window
24 reflector
30 elevator apparatus
32 thin plate-shaped seed single crystal
34 lower surface
36 winding shaft
38 rotating apparatus
40 thin plate-shaped single crystal
42 cover member
50 winding apparatus
52 fine line
54 supply apparatus
56 supply pipe
60 vibration prevention member
62 blocking member
70 preheating apparatus
80 chamber
82 placement table
84 position control apparatus
90 gas introduction device
92 introduction pipe
94 discharge pipe

TECHNICAL FIELD

The present invention relates to a thin plate-shaped single-crystal production equipment and a thin plate-shaped single-crystal production method that can continuously produce a thin plate-shaped single crystal having a thickness of several hundreds of micrometers.

BACKGROUND ART

In recent years, there has been a growing need to replace fossil fuels with renewable energy, and petroleum-consuming power generation methods are being replaced with power generation methods using solar batteries on a worldwide scale. However, the power generation cost of the solar photovoltaic power generation is still higher than that of other power generation methods, and there is a need for the development of high-efficiency low-cost solar batteries.

Various materials such as semiconductor silicon crystals, amorphous silicon, and compound semiconductors are known to be used as a substrate material included in solar batteries, and the development of these materials is being pursued. Of these, semiconductor silicon crystals are primary substrate materials. The universal size of the substrate is about 155 mm square and a thickness of about 0.3 mm. A product produced by subjecting a universal size silicon crystal substrate to treatment that allows solar photovoltaic power generation with high efficiency and attaching thereto electrodes for outputting electric power generated is referred to as a "cell." A product including a large number of cells arranged two-dimensionally is referred to as a "module." The module is installed according to its use environment and used as a solar photovoltaic power generation device.

To reduce the power generation cost of solar batteries, it is important to improve the performance of a substrate formed of semiconductor silicon crystals and used as a main component of cells and to develop a novel production method that allows a reduction in the production cost of the substrate material.

Solar batteries of the type called the HIT (Heterojunction with Intrinsic Thin-layer) type are solar batteries that can generate electric power with high efficiency and have a structure in which a phosphorus-doped N-type silicon single crystal plate is sandwiched between amorphous silicon layers to increase the usable wavelength range of sunlight.

It is known that the highest efficiency is achieved by the combined use of the HIT type and a back-contact type in which all electrodes for outputting the generated electricity are collected on the back side to eliminate electrodes on the front side. In the N-type silicon single crystal substrate used in this case, phosphorus must be added uniformly at an optimum chemical composition.

At present, there are two primary methods for producing silicon crystal substrates for general-purpose solar batteries. One of these methods is a unidirectional solidification method. In this method, a raw material is melted in a large quartz-made crucible and solidified from the lower side to the upper side. Then the obtained large bulk crystals are cut into universal size pieces to thereby produce crystal substrates.

However, the bulk crystals produced by the above method are boron-doped P-type polycrystals, and the unidirectional solidification method cannot be used in principle for the production of an N-type single crystal substrate necessary for the high-efficiency solar batteries described above.

The second method is the following method. A so-called pulling method including melting a raw material in a quartz crucible, immersing a seed single crystal in the obtained melt, and pulling the seed single crystal upward while the crystal is allowed to grow is used to produce a round rod-shaped single crystal. Then the produced round rod-shaped single crystal is cut to produce crystal substrates with a universal size.

The pulling method has two major problems. One of them is that the unit production cost is high.

The production cost of the single crystal rod obtained by the pulling method increases as the diameter of the single crystal rod increases. To obtain universal size substrates, a single crystal rod having a diameter of about 250 mm is necessary. However, universal size substrates are generally produced using a single crystal rod having a diameter of about 200 mm in order to reduce the production cost. In this case, the substrates have a quadrangular shape with four rounded corners, and their efficiency is lower than that of a substrate having an exact quadrangular shape.

The second problem of the pulling method is that the concentration of phosphorus added to obtain the N-type semiconductor cannot be made uniform. The phosphorus concentration in the melt of the raw material silicon doped with phosphorus is uniform. However, the phosphorus concentration of a portion solidified first as a single crystal is lower than the phosphorus concentration of the melt. This phenomenon is referred to as a "distribution phenomenon,"

and the ratio between the phosphorus concentration in the melt and the phosphorus concentration in the solidified product is referred to as a "distribution coefficient."

In the case of silicon, the distribution coefficient of phosphorus is about 0.35. Therefore, the phosphorus concentration of the portion solidified first is low, and the rest remains in the melt. Thus, the phosphorus concentration in the melt increases during solidification, and the phosphorus concentration in the solidified product increases according to the distribution coefficient. Therefore, a portion having an optimum chemical composition is present in only part of the single crystal.

Moreover, when about one half of the raw material melted first in the crucible is solidified, the phosphorus concentration becomes excessively high, so that the solidified product cannot be used for solar batteries. In this case, the following production method is used. The single crystal production operation is stopped. Then an inert atmosphere introduced into a production furnace is maintained, and the product is removed while the temperature of the raw material melt is maintained. Then a new particulate raw material is added to the remaining raw material melt to recover the initial chemical composition of the raw material melt. Then the production of a second single crystal is resumed.

In this production method, the quartz crucible holding the raw material melt is consumed. Therefore, the number of repeated uses of the quartz crucible is 2. Even when a specially prepared high-quality quartz crucible is used, the number of repeated uses of this quartz crucible is at most 3.

The largest problem with this production method is that the phosphorus concentration in the product cannot be made uniform. When solar battery cells are produced using only products having an optimum chemical composition, high efficiency can be achieved. However, the cost of the products with an optimum chemical composition is high, and this directly leads to an increase in power generation cost.

Therefore, when products having a lower phosphorus concentration than the products having the optimum chemical composition or products having a larger phosphorus concentration than the products having the optimum chemical composition are used to reduce the cost, the power generation efficiency of the module of course deteriorates.

Methods for reducing the production cost of silicon single crystal substrates for solar batteries other than the above methods have been vigorously developed. Of course, the possibility of reducing cutting wastes and production cost is higher when a thin plate single crystal having a prescribed thickness is produced from the beginning and then cut into pieces with a prescribed size than when a large bulk crystal is cut to produce thin plate single crystals.

Previously proposed thin plate-shaped silicon crystal production methods include three types of methods.

A first method is a method for producing a thin plate-shaped single crystal by inserting a jig called a die having a slit in a raw material melt melted in a crucible, immersing a thin plate-shaped seed single crystal in the raw material melt coming out to an upper portion of the die through the slit due to surface tension, and pulling the raw material melt upward while the raw material melt is allowed to solidify. This method is referred to as an EFG (Edge defined Film-fed Growth) method.

This production method has been vigorously developed mainly in the United States but has not been practically used for production of silicon substrates for solar batteries. The reasons for this are as follows. The material of the jig that can be stably used for a long time cannot be found, and it is difficult to control the temperature during solidification of the raw material melt, so that it is difficult to increase the size of the product.

A second method is a method named an ESR (Edge Stabilized Ribbon) method and using a string instead of the die. In the ESR method, first, a string is immersed in the surface of the raw material melt so as to extend horizontally and then slightly raised. Then the raw material melt raised together with the string due to surface tension is solidified and forms thin plate-shaped crystals.

Strings are connected to both sides of the string and raised together, and the solidified thin plate-shaped crystals are also raised while growing. In this method, the portion first raised together with the string and then solidified is a "polycrystal", and the thin plate grown together with this portion is also a "polycrystal" and is not a "single crystal."

A third method is a method named a dendritic web growth method. The dendrite has the property that, when the growth rate reaches a certain rate, the growth proceeds preferentially in a high thermal conductivity direction. This method utilizes this property of the dendrite to produce thin plate-shaped crystals.

Unlike the EFG method and the ESR method, this method uses no jig and no string and is thought to allow a single crystal to grow by controlling the growth optimally. However, in practice, a single crystal cannot be produced unless the initial dendrite is a single dendrite. There is no precedent for the continuous growth of a large and long thin plate-shaped single crystal using this method, and industrial production has not been achieved.

As described above, the previously reported thin plate-shaped crystal production methods are each a method for producing a crystal using a silicon melt held in a quartz crucible. When raw material silicon is melted in a quartz crucible as in these production methods, the silicon melt reacts with quartz as shown in formula 1 to form silicon monoxide (SiO).

[Math. 1]

(formula 1)

The silicon monoxide (SiO) formed by the reaction is mixed into the silicon crystal product, forms a solid solution, and is a main cause of deterioration of the performance of the single crystal. Therefore, to produce a high-quality single crystal, it is preferable to use a production method in which it is unnecessary to use a quartz crucible.

One practical method currently used for producing a silicon single crystal without using a crucible is a high-frequency floating-zone melting method for producing a single crystal by melting a raw material rod using high-frequency induction heating and solidifying the melted raw material (e.g., PTL 1). With the high-frequency floating-zone melting method, a high-purity single crystal containing no silicon monoxide (SiO) in the product can be obtained.

However, the raw material rod usable for the high-frequency floating-zone melting method is a specially prepared highly dense product. This raw material rod is expensive, and its supply amount is limited, so that the high-frequency floating-zone melting method is not suitable for solar batteries expected to be low cost. Moreover, with the high-frequency floating-zone melting method, it is very difficult to produce a thin plate-shaped single crystal, and there has been no report on the production of a thin plate-shaped single crystal.

Another known method for producing a high-purity single crystal without using a crucible is a method using an infrared ray. One known method for producing a single crystal using an infrared ray is an infrared floating-zone melting method for producing a single crystal rod by forming a raw material powder into a rod shape, subjecting the rod to local heating to melt the rod, and solidifying the melt.

In the infrared floating-zone melting method, the melt formed by heating using the infrared ray is held on the raw material rod through the surface tension of the melt itself to continue the melting and solidification of the raw material.

In the infrared floating-zone melting method, a method in which irradiation with the infrared ray is performed in a horizontal direction is conventionally used. However, with the horizontal irradiation method, a single crystal having a large diameter cannot be produced in principle.

Accordingly, an upper surface melting method has been developed which can produce a single crystal having a large diameter by irradiating the upper surface of a large-diameter seed single crystal disposed in a lower portion with an infrared ray to melt it and adding dropwise a raw material melt prepared by melting a raw material onto the upper surface. With the upper surface melting method, no limitation is in principle imposed on the diameter of a producible single crystal, so that the applicable range of the method has been increased dramatically.

Currently used industrial single crystal materials include, in addition to the above materials for solar batteries, various oxide materials including ferroelectric materials such as lithium niobate and lithium tantalate, fluorescent materials such as lutetium silicate and gadolinium silicate, and laser materials such as yttrium aluminum garnet and gadolinium gallium garnet.

Each of these oxide materials is used to produce a round rod-shaped single crystal by the pulling method. The round rod-shaped single crystal is cut into thin plate-shaped single crystals having a thickness of about 0.3 mm, and the single crystals are used for various devices. However, with the pulling method, contamination from the crucible material to the product cannot be avoided. Moreover, the concentration of a useful dopant in the product cannot in principle be made uniform because of the distribution phenomenon described above. Therefore, problems occur in the production of high-quality devices.

Therefore, a high-performance product can be produced at much lower cost when a thin plate-shaped single crystal having an optimum chemical composition and a prescribed thickness is produced from the beginning and used than when a round rod-shaped single crystal is produced and cut into a thin plate-shaped single crystal.

CITATION LIST

Patent Literature

PTL 1: Japanese Patent No. 5279727

SUMMARY OF INVENTION

Technical Problem

However, the results of the previous research and development on the thin plate-shaped single-crystal production methods are insufficient, and the industrial application of the production of a thin plate-shaped single crystal is limited only to the production of a sapphire single crystal plate, a gallium oxide single crystal plate, etc. using the EFG method.

The present invention has been made in view of the foregoing circumstances, and it is an object to provide a thin plate-shaped single-crystal production equipment and a thin plate-shaped single-crystal production method that can continuously produce at low cost with high precision a thin plate-shaped single crystal having a uniform dopant concentration at an optimum chemical composition and having a thickness of several hundreds of micrometers.

Solution to Problem

The present invention has been made to solve the problems in the conventional technologies.

The thin plate-shaped single-crystal production equipment of the present invention includes:
  an infrared ray irradiation apparatus that irradiates an upper surface of a raw material lump for production of a thin plate-shaped single crystal (hereinafter referred to also as a raw material lump) with an infrared ray to melt the upper surface; and
  an elevator apparatus that causes a lower surface of a thin plate-shaped seed single crystal to be immersed in a melt melted using the infrared ray irradiation apparatus and formed on the upper surface and then pulls the thin plate-shaped seed single crystal immersed in the melt upward,
  wherein the thin plate-shaped single-crystal production equipment is configured such that, by using the elevator apparatus to immerse the lower surface of the thin plate-shaped seed single crystal in the melt formed on the upper surface of the raw material lump for the production of the thin plate-shaped single crystal using the infrared ray irradiation apparatus, growth of a single crystal is started from the lower surface of the immersed thin plate-shaped seed single crystal and that, by using the elevator apparatus to pull the thin plate-shaped seed single crystal upward, the thin plate-shaped single crystal is produced continuously.

In the above structure, the number of members forming the equipment is small, and a thin plate-shaped single crystal having a uniform dopant concentration at an optimum chemical composition and having a thickness of several hundreds of micrometers can be produced at low cost with high precision. Moreover, a uniform chemical composition thin plate-shaped single crystal of a non-congruent melting material such as an incongruent melting material or a solid solution material can be produced with high precision.

The thin plate-shaped single-crystal production equipment of the present invention is characterized in that
  the infrared ray emitted from the infrared ray irradiation apparatus is a laser beam.

When the infrared ray is the laser beam, a prescribed area of the raw material lump can be heated precisely. Therefore, the melt (melt pool) can be formed continuously in a reliable manner without spilling of the melt from the upper surface of the raw material lump.

The thin plate-shaped single-crystal production equipment of the present invention is also characterized in that:
  a shape of an irradiation area irradiated with the laser beam is a hollow quadrangular shape elongated in a horizontal direction; the thin plate-shaped single-crystal production equipment being configured for a circumferential area of the upper surface of the raw material lump for the production of the thin plate-shaped single crystal to be irradiated with the laser beam such that the hollow quadrangular irradiation area is formed in the circumferential area of the upper surface, the circumferential area excluding a central portion of the upper surface.

By irradiating the circumferential area, excluding the central portion, of the upper surface of the raw material lump with the laser beam such that the laser beam is fitted in the circumferential area and that the hollow quadrangular irradiation area is formed in the circumferential area, the circumferential area, excluding the central portion, of the upper surface of the raw material lump is first melted, and the central portion not irradiated with the laser beam is melted by heat transferred from the melt in the circumferential area melted first.

Therefore, the temperature of the central portion can be controlled so as to be lower than the temperature of the circumferential area. To form the hollow quadrangular irradiation area irradiated with the laser beam, the hollow quadrangular irradiation area may be irradiated with, for example, linear laser beams from four sides.

The upper surface of the raw material lump may be irradiated with the laser beam obliquely from above or vertically from above. It is preferable that the irradiation angle can be adjusted to an optimum angle according to the thermal conduction properties of the single crystal material or the thickness of the thin plate-shaped single crystal to be produced.

To produce the thin plate-shaped single crystal continuously by melting the raw material lump, it is necessary to continuously melt the raw material lump and solidify the thin plate-shaped single crystal simultaneously. However, it is necessary to heat the raw material lump to melt it, and it is necessary to cool the melt to solidify the thin plate-shaped single crystal.

Therefore, to allow the thin plate-shaped single crystal to be produced stably, contradictory actions, i.e., "heating" and "cooling," must be continued stably in a well-controllable manner. By irradiating the raw material lump with the hollow quadrangular laser beam, the above actions can be achieved.

Specifically, when the melt pool on the upper surface of the raw material lump has the above temperature distribution, the thin plate-shaped single crystal can be grown from the central portion stably and continuously.

The thin plate-shaped single-crystal production equipment of the present invention is also characterized in that:
the elevator apparatus includes
a winding apparatus that continuously winds the thin plate-shaped single crystal to be produced into a roll;
the winding apparatus includes
a winding shaft that winds the thin plate-shaped single crystal continuously and
a rotating apparatus that rotates the winding shaft; and
the thin plate-shaped single-crystal production equipment is configured such that the thin plate-shaped seed single crystal is suspended from the winding shaft.

With the winding apparatus having the above structure, the thin plate-shaped single crystal produced continuously can be reliably wound around the winding shaft, and the size of the equipment is not increased unnecessarily. Moreover, since the thin plate-shaped single crystal produced is in the form of a roll, the thin plate-shaped single crystal can be easily conveyed during shipment, so that its handleability is high.

The thin plate-shaped single-crystal production equipment of the present invention is also characterized in that
the thin plate-shaped seed single crystal is suspended from the winding shaft using a plurality of thin lines.

When the thin plate-shaped seed single crystal is suspended using heat resistant high-strength thin lines, the thin plate-shaped single crystal produced continuously can be reliably wound around the winding shaft.

Preferably, in the thin plate-shaped single-crystal production equipment of the present invention,
portions of the thin plate-shaped seed single crystal to which the thin lines are attached each have a thickness equal to or less than a thickness of the thin plate-shaped single crystal to be produced.

When the thickness of the portions of the thin plate-shaped seed single crystal to which the thin lines are attached is set to be equal to or less than the thickness of the thin plate-shaped single crystal to be produced as described above, breakage of the thin plate-shaped single crystal that may occur when the surface of the thin plate-shaped single crystal comes into contact with the thin lines during winding of the thin plate-shaped single crystal around the winding shaft can be reliably prevented.

The thin plate-shaped single-crystal production equipment of the present invention is also characterized in that
a required amount of a liquid phase composition that coexists in equilibrium with a chemical composition of the thin plate-shaped single crystal to be produced is disposed on the upper surface of the raw material lump for the production of the thin plate-shaped single crystal at the beginning of the production.

By disposing the required amount of the liquid phase composition that coexists in equilibrium with the chemical composition of the thin plate-shaped single crystal to be produced on the upper surface of the raw material lump from the beginning as described above, the thin plate-shaped single crystal produced continuously can have a uniform optimum chemical composition.

The thin plate-shaped single-crystal production equipment of the present invention is also characterized by further including a vibration prevention member that is disposed between the elevator apparatus and the raw material lump for the production of the thin plate-shaped single crystal and prevents vibrations of the thin plate-shaped single crystal to be produced continuously.

When the vibration prevention member is disposed as described above, the thin plate-shaped single crystal produced is prevented from vibrating excessively in left and right directions. Therefore, the thin plate-shaped single crystal can stay within a prescribed range without displacement of the growth position, and the high-quality thin plate-shaped single crystal can be produced continuously and stably.

Preferably, the thin plate-shaped single-crystal production equipment of the present invention further includes
a blocking member that is disposed between the elevator apparatus and the raw material lump for the production of the thin plate-shaped single crystal and blocks radiant heat emitted from the melt such that the radiant heat is obstructed from reaching the thin plate-shaped single crystal to be produced continuously.

The thin plate-shaped single crystal is solidified while pulled up from the melt. When the radiant heat emitted from the melt reaches the thin plate-shaped single crystal produced, it is difficult to increase the production rate of the thin plate-shaped single crystal. Therefore, by disposing the blocking member, the radiant heat from the melt is obstructed from reaching the thin plate-shaped single crystal produced, and the efficiency of production of the thin plate-shaped single crystal can be increased.

The thin plate-shaped single-crystal production equipment of the present invention is also characterized in that
 the raw material lump for the production of the thin plate-shaped single crystal has a substantially cuboidal shape.

When the raw material lump has such a shape, the melt (melt pool) can be continuously provided on the upper surface of the raw material lump by irradiation with the infrared ray.

The thin plate-shaped single-crystal production equipment of the present invention is also characterized in that
 dimensions of the upper surface of the raw material lump for the production of the thin plate-shaped single crystal are set to be larger by several millimeters or more than dimensions of the lower surface of the thin plate-shaped seed single crystal in both a thickness direction and a transverse direction.

When the dimensions of the raw material lump and the dimensions of the thin plate-shaped seed single crystal are set as described above, the entire lower surface of the thin plate-shaped seed single crystal can be immersed in the melt, and a thin plate-shaped single crystal having a desired size can be produced continuously.

The thin plate-shaped single-crystal production equipment of the present invention is also characterized by further including:
 a placement table on which the raw material lump for the production of the thin plate-shaped single crystal is to be placed; and
 a position control apparatus that controls a position of the placement table such that the placement table is positioned at a prescribed position.

When the position (particularly the vertical position) of the placement table can be controlled as described above, even when the liquid level of the melt on the raw material lump is lowered when the thin plate-shaped single crystal is pulled up, the position of the raw material lump can be raised such that the original position is maintained, so that the liquid level can be controlled so as to be positioned always at the same position. Therefore, the irradiation position of the infrared ray can be always fixed to the same position, and the thin plate-shaped single crystal can be produced continuously and stably with high yield.

When the upper surface of the raw material lump is irradiated with a collimated laser beam from a direction perpendicular to the upper surface, the irradiation intensity of the laser beam is unchanged even when the liquid level of the melt on the raw material lump is lowered, and therefore it is unnecessary to control the liquid level of the melt on the raw material lump such that the liquid level is maintained constant.

The thin plate-shaped single-crystal production equipment of the present invention is also characterized in that
 the elevator apparatus is configured such that the lower surface of the thin plate-shaped seed single crystal is immersed in a central portion of the melt on the upper surface of the raw material lump for the production of the thin plate-shaped single crystal, the melt being melted using the infrared ray irradiation apparatus.

The central portion of the melt is a portion in which the melt is steadily pooled. By immersing the lower surface of the thin plate-shaped seed single crystal in the central portion, the thin plate-shaped single crystal can be produced continuously by pulling the thin plate-shaped seed single crystal upward using the elevator apparatus.

The thin plate-shaped single-crystal production equipment of the present invention is also characterized by further including
 a preheating apparatus that is disposed around the raw material lump for the production of the thin plate-shaped single crystal and preheats the raw material lump for the production of the thin plate-shaped single crystal in advance.

By preheating the raw material lump to a temperature near its melting point as described above, the amount of irradiation with the infrared ray using the infrared ray irradiation apparatus can be reduced. In this case, by increasing the adjustment accuracy at the same time, the range of the melt pool can be finely controlled. Therefore, the thin plate-shaped single crystal can be continuously produced stably with high precision.

Preferably, in the thin plate-shaped single-crystal production equipment of the present invention, at least the raw material lump for the production of the thin plate-shaped single crystal is disposed in a chamber, and
 the elevator apparatus is disposed on an upper portion of the chamber.

When the raw material lump is disposed in the chamber, the thin plate-shaped single crystal can be produced in an atmosphere suitable for the single crystal material.

The thin plate-shaped single-crystal production equipment of the present invention is also characterized by further including
 a gas introduction device that fills the chamber with an atmosphere gas containing a dopant.

When the gas introduction device is provided as described above, an atmosphere suitable for the characteristics of the material of the thin plate-shaped single crystal to be produced can be introduced into the chamber, and a high-quality thin plate-shaped single crystal having a uniform dopant concentration at an optimum chemical composition can be produced.

The thin plate-shaped single-crystal production equipment of the present invention is also characterized in that
 a plurality of the elevator apparatuses is disposed above the raw material lump for the production of the thin plate-shaped single crystal.

In the above structure, for example, a plurality of thin plate-shaped seed single crystals may be immersed in one melt pool and then pulled upward using the respective elevator apparatuses. In this case, the efficiency of production of the thin plate-shaped single crystals can be significantly higher than that when one elevator apparatus is used.

In the thin plate-shaped single-crystal production equipment of the present invention, the thin plate-shaped seed single crystal has a thickness in a range of preferably 300 µm to 500 µm.

When the thickness is in the above range, the high-purity thin plate-shaped single crystal produced continuously can be wound and can have a large length.

In the thin plate-shaped single-crystal production equipment of the present invention, the thin plate-shaped single crystal has a thickness in the range of, preferably 100 µm to 3000 µm.

The thickness of the thin plate-shaped single crystal produced can be in the range of 100 µm to 3000 µm. When the winding apparatus is assumed to be used for winding, the thickness is preferably in the range of 100 µm to 500 µm.

However, the thickness can be adjusted to less than 100 μm or more than 500 μm by controlling the temperature of the melt and the pulling rate.

When the thin plate-shaped single crystal is thicker than 500 μm, the diameter of the roll produced by winding the thin plate-shaped single crystal around the winding shaft of the winding apparatus is large. In this case, the thin plate-shaped single crystal may not be wound but may be pulled upward to form a product. In particular, when a silicon thin plate-shaped single crystal for solar batteries is produced, the thickness of the thin plate-shaped single crystal is in the range of preferably 200 μm to 400 μm.

The thin plate-shaped single-crystal production method of the present invention includes at least:
- a melting step of melting an upper surface of a raw material lump for production of a thin plate-shaped single crystal by irradiating the upper surface of the raw material lump for the production of the thin plate-shaped single crystal with an infrared ray using an infrared ray irradiation apparatus;
- a growing step of starting growth of a single crystal from a lower surface of a thin plate-shaped seed single crystal by immersing the lower surface of the thin plate-shaped seed single crystal in a melt using an elevator apparatus, the melt being formed on the upper surface of the raw material lump for the production of the thin plate-shaped single crystal in the melting step; and
- a continuous production step of continuously producing the thin plate-shaped single crystal by pulling upward the thin plate-shaped seed single crystal from which the growth of the single crystal has been started in the growing step.

With the above production method, a thin plate-shaped single crystal having a uniform dopant concentration at an optimum chemical composition and having a thickness of several hundreds of micrometers can be continuously produced at low cost with high precision.

The thin plate-shaped single-crystal production method of the present invention is characterized in that,
in the melting step,
the infrared ray emitted from the infrared ray irradiation apparatus is a laser beam.

When the infrared ray is the laser beam, a prescribed area of the raw material lump that has a desired shape can be heated precisely. Therefore, the melt can be formed continuously in a reliable manner without spilling of the melt from the upper surface of the raw material lump.

The thin plate-shaped single-crystal production method of the present invention is characterized in that:
in the melting step,
a shape of an irradiation area irradiated with the laser beam is a hollow quadrangular shape elongated in a horizontal direction; and
a circumferential area of the upper surface of the raw material lump for the production of the thin plate-shaped single crystal is irradiated with the laser beam such that the hollow quadrangular irradiation area is formed in the circumferential area of the upper surface, the circumferential area excluding a central portion of the upper surface.

By irradiating the circumferential area, excluding the central portion, of the upper surface of the raw material lump with the laser beam such that the laser beam is fitted in the circumferential area and that the hollow quadrangular irradiation area is formed in the circumferential area, the circumferential area, excluding the central portion, of the upper surface of the raw material lump is first melted, and the central portion not irradiated with the laser beam is melted by heat transferred from the melt in the circumferential area melted first.

Therefore, the temperature of the central portion can be controlled so as to be lower than the temperature of the circumferential area. This allows contradictory actions, i.e., melting of the raw material lump and solidification from the melt, to be continued stably in a well-controllable manner.

Specifically, by forming the above temperature distribution in the melt pool on the upper surface of the raw material lump, the thin plate-shaped single crystal can be continuously grown from the central portion stably.

The upper surface of the raw material lump may be irradiated with the laser beam obliquely from above or vertically from above. It is preferable that the irradiation angle is adjusted to an optimum angle according to the thermal conductivity and thickness of the material of the thin plate-shaped single crystal. When a material having a high thermal conductivity is used, it is preferable that the irradiation angle of the laser beam is controlled such that the angle with respect to the horizontal direction is increased. When a material having a low thermal conductivity is used, it is preferable that the irradiation angle of the laser beam is controlled such that the angle with respect to the horizontal direction is reduced.

The thin plate-shaped single-crystal production method of the present invention is characterized by further including a winding step of, after the continuous production step, winding the thin plate-shaped single crystal produced continuously into a roll.

When the thin plate-shaped single-crystal production method includes the winding step, the thin plate-shaped single crystal produced continuously can be reliably wound into a roll, and the thin plate-shaped single crystal can be produced efficiently.

The thin plate-shaped single-crystal production method of the present invention is also characterized in that,
in the melting step,
when the thin plate-shaped single crystal to be produced is an incongruent melting material, a required amount of a liquid phase composition (the liquid phase is referred to as a solvent phase) that coexists in equilibrium with a chemical composition of the thin plate-shaped single crystal is disposed on the upper surface of the raw material lump for the production of the thin plate-shaped single crystal at the beginning of the production.

The thin plate-shaped single-crystal production method of the present invention is also characterized in that,
in the melting step,
when the thin plate-shaped single crystal to be produced is a solid solution material containing a dopant, a required amount of a liquid phase composition (the liquid phase is referred to as a solvent phase) that coexists in equilibrium with a chemical composition of the thin plate-shaped single crystal is disposed on the upper surface of the raw material lump for the production of the thin plate-shaped single crystal at the beginning of the production.

In these cases, when the thin plate-shaped single crystal is solidified from the solvent phase first formed on the upper surface of the raw material lump, the amount of the solvent phase decreases, and the amount of the crystal component in the chemical composition decreases. Therefore, the intensity of the laser beam that reaches a portion below the solvent phase increases, and its temperature increases, so that the melting of the raw material lump is facilitated.

In this case, crystallization and the melting of the raw material lump proceed simultaneously, and therefore the dopant concentration in the product obtained (the thin plate-shaped single crystal) is the same as the dopant concentration in the raw material lump and is uniform. This scheme is referred to as a "traveling solvent method" and is an only means that allows a single crystal product having a uniform chemical composition to be produced using a melt method.

By disposing the required amount of the liquid phase composition that coexists in equilibrium with the chemical composition of the thin plate-shaped single crystal to be produced on the upper surface of the raw material lump at the beginning as described above, the thin plate-shaped single crystal produced continuously can have a uniform optimum chemical composition.

The thin plate-shaped single-crystal production method of the present invention is also characterized in that,
in the growing step,
the lower surface of the thin plate-shaped seed single crystal is immersed in a central portion of the melt formed on the upper surface of the raw material lump for the production of the thin plate-shaped single crystal.

The central portion of the melt is a portion in which the melt is steadily pooled. By immersing the lower surface of the thin plate-shaped seed single crystal in the central portion, the thin plate-shaped single crystal can be produced continuously by pulling the thin plate-shaped seed single crystal upward using the elevator apparatus.

Advantageous Effects of Invention

In the thin plate-shaped single-crystal production equipment of the invention and the thin plate-shaped single-crystal production method of the invention, the upper surface of the raw material lump for the production of the thin plate-shaped single crystal is melted by the infrared ray to form a melt, and the thin plate-shaped seed single crystal is immersed in the melt and then pulled upward. In this manner, a thin plate-shaped single crystal having a uniform dopant concentration at an optimum chemical composition and having a thickness of several hundreds of micrometers can be continuously produced at low cost with high precision.

BRIEF DESCRIPTION OF DRAWINGS

FIG. 1 is a schematic illustration of a thin plate-shaped single-crystal production equipment in a first embodiment of the present invention.

FIG. 2 is an illustration showing the shape of an irradiation area irradiated with a laser beam emitted from an infrared ray irradiation apparatus.

FIG. 3 is a conceptual illustration when a raw material lump for the production of the thin plate-shaped single crystal is viewed from an upper surface side in the thin plate-shaped single-crystal production equipment.

FIG. 4 is another schematic illustration of the thin plate-shaped single-crystal production equipment in the first embodiment of the present invention.

FIG. 5 is an illustration for explaining the state of a melt (melt pool) formed on the upper surface of the raw material lump for the production of the thin plate-shaped single crystal in the thin plate-shaped single-crystal production equipment shown in FIG. 1.

FIG. 6 is an illustration for explaining the state of a melt (melt pool) formed on the upper surface of the raw material lump for the production of the thin plate-shaped single crystal in the thin plate-shaped single-crystal production equipment shown in FIG. 4.

FIG. 7 is a schematic perspective view for explaining the state of the raw material lump for the production of the thin plate-shaped single crystal, the thin plate-shaped seed single crystal and the thin plate-shaped single crystal.

FIG. 8 is a schematic illustration of a thin plate-shaped single-crystal production equipment in a second embodiment of the present invention.

FIG. 9 is a schematic illustration of another thin plate-shaped single-crystal production equipment in the second embodiment of the present invention.

FIG. 10 is a schematic illustration of a thin plate-shaped single-crystal production equipment in a third embodiment of the present invention.

FIG. 11 is an enlarged illustration of a main part of the thin plate-shaped single-crystal production equipment shown in FIG. 10.

FIG. 12 shows schematic illustrations of steps in the thin plate-shaped single-crystal production method of the present invention.

FIG. 13 shows schematic illustrations of steps in the thin plate-shaped single-crystal production method of the present invention.

DESCRIPTION OF EMBODIMENTS

The thin plate-shaped single-crystal production equipment of the invention and the thin plate-shaped single-crystal production method of the invention will be described in more detail based on the drawings.

The thin plate-shaped single-crystal production equipment of the invention and the thin plate-shaped single-crystal production method of the invention are used to produce a thin plate-shaped single crystal having a uniform dopant concentration at an optimum chemical composition and having a thickness of several hundreds of micrometers continuously at low cost with high precision.

<Thin Plate-Shaped Single-Crystal Production Equipment 10>

First Embodiment

As shown in FIG. 1, in a thin plate-shaped single-crystal production equipment 10 in a first embodiment of the present invention, a raw material lump for the production of the thin plate-shaped single crystal (hereinafter referred to also as a raw material lump) 12 is placed on a placement table 82 disposed in a lower portion of a chamber 80. The raw material lump 12 has a substantially cuboidal shape and is, for example, a plate-shaped body such as a book.

Infrared ray irradiation apparatuses 20 are provided beside an upper portion of the chamber 80 and irradiate an upper surface 14 of the substantially cuboidal raw material lump 12 with respective infrared rays 16 to melt the upper surface 14.

Preferably, the infrared rays 16 emitted from the infrared ray irradiation apparatuses 20 are each a laser beam 16a.

Specifically, as shown in FIG. 2, the shape of the irradiation area irradiated with the laser beams 16a is a hollow quadrangular shape elongated in a horizontal direction (the vertical direction in FIG. 2). As shown in FIG. 3, it is preferable that the upper surface 14 of the raw material lump 12 is irradiated with the laser beams 16a such that the hollow quadrangular irradiation area elongated in the horizontal direction is formed in a circumferential area of the upper surface 14 of the raw material lump 12 so as to be fitted in the circumferential area, the circumferential area of the upper surface 14 excluding its central portion.

Preferably, the laser beams 16a emitted from the infrared ray irradiation apparatuses 20 enter the chamber 80 through windows 22 provided in side portions of the chamber 80 and are incident on the circumferential area, excluding the central portion, of the upper surface 14 of the raw material lump 12 through reflectors 24 in the chamber 80. In this case, the upper surface 14 of the raw material lump 12 may be irradiated with the laser beams 16a obliquely from above as shown in FIG. 1, or the upper surface 14 of the raw material lump 12 may be irradiated with the laser beams 16a vertically from above as shown in FIG. 4. The irradiation angle is adjusted to an optimum angle according to the thermal conductivity of the single crystal material, the thickness of a thin plate-shaped single crystal 40 to be produced, etc.

In this manner, the circumferential area, excluding the central portion, of the upper surface 14 of the raw material lump 12 melts before the central portion melts, and the central portion not irradiated with the laser beams 16a is melted by heat transferred from a melt 18 in the circumferential area melted first.

Therefore, the temperature of the central portion is controlled so as to be lower than the temperature of the circumferential area. When the melt 18 (melt pool) on the upper surface 14 of the raw material lump 12 has the above temperature distribution, the thin plate-shaped single crystal 40 can be grown from the central portion stably and continuously.

Specifically, by irradiating the circumferential area, excluding the central portion, of the upper surface 14 of the raw material lump 12 with the laser beams 16a as shown in FIGS. 5 and 6, the melt 18 formed in the circumferential area extends to a larger depth, and the melt 18 formed in the central portion has a lower temperature than in the circumferential area and extends to a smaller depth.

As shown in FIGS. 1, 3, and 4, a preheating apparatus 70 that preheats the raw material lump 12 is disposed around the raw material lump 12. Preferably, the raw material lump 12 is preheated to a temperature near its melting point before the upper surface 14 of the raw material lump 12 is melted using the infrared ray irradiation apparatuses 20. By preheating the raw material lump 12 as described above, the amount of irradiation with the infrared rays 16 using the infrared ray irradiation apparatuses 20 can be significantly reduced, and the range of the melt 18 (melt pool) can be finely adjusted by finely controlling the positions and the amount of irradiation.

An elevator apparatus 30 is disposed on an upper portion of the chamber 80. The elevator apparatus 30 causes a lower surface 34 of a thin plate-shaped seed single crystal 32 to be immersed in the melt 18 melted using the infrared ray irradiation apparatuses 20 and formed on the upper surface 14 of the raw material lump 12 and then pulls the immersed thin plate-shaped seed single crystal 32 upward.

No particular limitation is imposed on the elevator apparatus 30. Preferably, the elevator apparatus 30 is, for example, a winding apparatus 50 that continuously winds the produced thin plate-shaped single crystal 40 into a roll. The winding apparatus 50 has a specific structure including a winding shaft 36 that continuously winds the thin plate-shaped single crystal 40 produced and a rotating apparatus 38 that rotates the winding shaft 36.

The dimensions of the lower surface 34 of the thin plate-shaped seed single crystal 32 are set to be smaller than the dimensions of the upper surface 14 of the raw material lump 12. A specific example of the relation between their dimensions is as follows. The dimensions of the upper surface 14 of the raw material lump 12 are set to be larger by several mm or more than the dimensions of the lower surface 34 of the thin plate-shaped seed single crystal 32 in both the thickness and transverse directions. Specifically, their dimensions are set such that the entire lower surface 34 of the thin plate-shaped seed single crystal 32 can be immersed in the melt 18.

Then, as shown in FIG. 7, the elevator apparatus 30 is used to immerse the lower surface 34 of the thin plate-shaped seed single crystal 32 in the central portion of the melt 18 formed on the upper surface 14 of the raw material lump 12 using the infrared ray irradiation apparatuses 20. The growth of a single crystal is thereby started from the immersed lower surface 34 of the thin plate-shaped seed single crystal 32. Then the elevator apparatus 30 is used to pull the thin plate-shaped seed single crystal 32 upward, and the thin plate-shaped single crystal 40 is thereby produced continuously.

The thickness of the produced thin plate-shaped single crystal 40 in a steady state can be controlled by adjusting the temperature of the melt, the pulling rate of the thin plate-shaped seed single crystal 32, etc. and can be adjusted to, for example, 100 μm to 3000 μm or more. However, when the thickness of the thin plate-shaped single crystal 40 exceeds 500 μm, a large winding apparatus 50 must be used. Therefore, when the thickness exceeds 500 μm, the thin plate-shaped single crystal 40 may not be wound and may be pulled upward to form a product. In particular, when a silicon thin plate-shaped single crystal for solar batteries is produced, the thickness of the thin plate-shaped single crystal 40 is preferably in the range of 200 μm to 400 μm.

There is a correlation between the temperature of the melt and the pulling rate. Specifically, when the temperature of the melt is high, the amount of cooling necessary for the growth of the thin plate-shaped single crystal 40 is large, so that the pulling rate is reduced. When the temperature of the melt is low, the efficiency of production of the thin plate-shaped single crystal 40 can be increased by increasing the pulling rate of the thin plate-shaped single crystal 40. However, if the pulling rate is excessively high, so-called "cellular growth" is likely to occur, and the crystal characteristics of the thin plate-shaped single crystal 40 deteriorate. It is therefore preferable to control the pulling rate appropriately.

The thickness of the thin plate-shaped seed single crystal 32 immersed in the melt 18 may be, for example, about 300 μm to 500 μm. It is preferable that the thin plate-shaped seed single crystal 32 has such a thickness because a thin plate-shaped single crystal 40 having a desired thickness can be continuously produced by controlling the temperature of the melt and the pulling rate.

In FIGS. 1 and 4, the thickness of the illustrated thin plate-shaped single crystal 40 and the thickness of the illustrated thin plate-shaped seed single crystal 32 differ from each other. This is for the purpose of distinguishing the thin plate-shaped single crystal 40 and the thin plate-shaped seed single crystal 32 from each other in the illustrations and is not intended to limit the relation between their thicknesses.

Preferably, the thin plate-shaped seed single crystal 32 is suspended from the winding shaft 36 of the winding apparatus 50 through a plurality of heat-resistant high-strength fine lines 52 (three fine lines in FIG. 7). In particular, when the thickness of portions of the thin plate-shaped seed single crystal 32 to which the fine lines 52 are attached is equal to or less than the thickness of the thin plate-shaped seed single crystal 32, breakage of the thin plate-shaped single crystal 40 that may occur when the surface of the thin plate-shaped single crystal 40 comes into contact with the fine lines 52 during winding of the thin plate-shaped single crystal 40 around the winding shaft 36 can be reliably prevented.

No particular limitation is imposed on the method for attaching the fine lines 52 to the thin plate-shaped seed single crystal 32. For example, the following method may be used. Several through holes for tying the fine lines 52 are formed in an edge portion of the thin plate-shaped seed single crystal 32, and recessed grooves are formed on both sides of the thin plate-shaped seed single crystal 32 so as to be connected to the through holes. In this manner, when the fine lines 52 are tied to the thin plate-shaped seed single crystal 32, the fine lines 52 are fitted into the recessed grooves, and therefore the fine lines 52 do not protrude outward from the thin plate-shaped seed single crystal 32. In this manner, breakage of the thin plate-shaped single crystal 40 that may occur when the surface of the thin plate-shaped single crystal 40 comes into contact with the fine lines 52 during winding of the thin plate-shaped single crystal 40 around the winding shaft 36 can be reliably prevented.

In the thin plate-shaped single-crystal production equipment 10, it is preferable that a vibration prevention member 60 and a blocking member 62 are disposed between the elevator apparatus 30 and the raw material lump 12. The vibration prevention member 60 prevents vibrations of the thin plate-shaped single crystal 40 produced continuously so that the growth position is not displaced and falls within a prescribed range. The blocking member 62 blocks radiant heat emitted from the melt 18 such that the radiant heat is obstructed from reaching the thin plate-shaped single crystal 40 produced continuously.

By disposing the vibration prevention member 60, the thin plate-shaped single crystal 40 produced is prevented from vibrating excessively in left and right directions, and the displacement of the growth position can be prevented, so that the high-quality thin plate-shaped single crystal 40 can be produced continuously.

By disposing the blocking member 62, the rate of the production of the thin plate-shaped single crystal 40 can be increased. Specifically, a method including melting a raw material and solidifying the molten raw material as a single crystal is referred to as a melt method. The growth rate of the single crystal in the melt method can be increased by efficiently dissipating latent heat of crystallization emitted during solidification of the crystal through heat transfer through the single crystal in contact with the melt.

Therefore, by disposing the blocking member 62 such that, for example, the optical paths of the infrared rays 16 (the laser beams 16a) are not blocked, the amount of the radiant heat reaching the thin plate-shaped single crystal 40 can be reduced. This can prevent the temperature of the thin plate-shaped single crystal 40 from increasing, so that the latent heat of crystallization can be efficiently dissipated. Therefore, the efficiency of production of the thin plate-shaped single crystal 40 can be increased.

As described above, by using the thin plate-shaped single-crystal production equipment 10, the thin plate-shaped single crystal 40 can be produced continuously. However, during the continuous production of the thin plate-shaped single crystal 40, the amount of the melt 18 formed on the upper surface 14 of the raw material lump 12 decreases, and the position of the upper surface 14 is lowered. When the position of the upper surface 14 is lowered, it is necessary to control the irradiation position irradiated with the infrared rays from the infrared ray irradiation apparatuses 20 such that the irradiation position is adjusted to a desired position.

In the present embodiment, instead of controlling the irradiation position irradiated with the infrared rays 16, a position control apparatus 84 that controls the vertical position of the placement table 82 is provided in the placement table 82 on which the raw material lump 12 is to be placed.

When the position control apparatus 84 is provided as described above, even when the position of the melt 18 on the upper surface 14 of the raw material lump 12 is lowered as the thin plate-shaped single crystal 40 produced continuously is pulled upward, the placement table 82 is raised such that the position of the melt 18 on the upper surface 14 of the raw material lump 12 is maintained at the initial position, so that the liquid level of the melt 18 can be maintained at the same position.

It is therefore only necessary to cause the infrared rays 16 to be incident always on the same positions, and the thin plate-shaped single crystal 40 can be produced stably and continuously at high yield. When the upper surface 14 of the raw material lump 12 is irradiated with the laser beams 16a vertically from immediately above the raw material lump 12 as in the thin plate-shaped single-crystal production equipment 10 shown in FIGS. 4 and 6, the temperature of the melt 18 is unchanged even when the position of the upper surface 14 of the raw material lump 12 varies. It is therefore unnecessary to control the position of the upper surface 14 of the raw material lump 12.

The raw material lump 12 used for the above-described thin plate-shaped single-crystal production equipment 10 has the chemical composition of the material of the thin plate-shaped single crystal 40 to be produced. However, the material of the thin plate-shaped single crystal 40 may be an incongruent melting material. In this case, even when this raw material lump 12 itself is melted and solidified in the thin plate-shaped single-crystal production equipment 10, a target thin plate-shaped single crystal 40 cannot be obtained.

Therefore, a liquid phase amount of a liquid phase composition that coexists in equilibrium with the chemical composition of the material of the thin plate-shaped single crystal 40 to be produced is placed on the upper surface 14 of the raw material lump 12 and is first melted. In this case, the molten solvent is placed on the upper surface 14 of the raw material lump 12.

When the thin plate-shaped single crystal 40 is produced after the placement of the liquid phase composition, the amount of the raw material lump 12 melted is the same as the amount of the solidified single crystal, so that the amount and chemical composition of the solvent are unchanged from the beginning to the end. It appears as if the solvent phase dissolves the raw material lump 12 and moves while the single crystal is precipitated.

This scheme is referred to as the "traveling solvent method." When the thin plate-shaped single crystal 40 obtained using the thin plate-shaped single-crystal production equipment 10 is an incongruent melting material or a solid solution material containing a dopant, it is important to use the "traveling solvent method" in order to make the dopant concentration in the obtained thin plate-shaped single crystal 40 constant.

Second Embodiment

Next, a second embodiment of the thin plate-shaped single-crystal production equipment 10 of the present invention will be described.

FIGS. 8 and 9 show the thin plate-shaped single-crystal production equipment 10 in the second embodiment of the present invention.

The thin plate-shaped single-crystal production equipment 10 shown in FIGS. 8 and 9 have basically the same structure as the thin plate-shaped single-crystal production equipment 10 in the first embodiment shown in FIGS. 1 to 7, and the same components are denoted by the same reference numerals. Their detailed description will be omitted, and differences will be described.

As shown in FIGS. 8 and 9, the thin plate-shaped single-crystal production equipment 10 in the second embodiment of the present invention differ from the thin plate-shaped single-crystal production equipment 10 in the first embodiment in that a gas introduction device 90 that fills the chamber 80 with an atmosphere gas containing a dopant is provided for the chamber 80.

The gas introduction device 90 is disposed beside an upper side portion of the chamber 80 and configured to introduce the atmosphere gas from the gas introduction device 90 through an introduction pipe 92 to the chamber 80. A discharge pipe 94 is disposed in a lower side portion of the chamber 80, and the atmosphere gas can be discharged from the discharge pipe 94 to the outside of the chamber 80.

In this case, a state in which the chamber 80 is filled with the atmosphere gas suitable for the production of the thin plate-shaped single crystal 40 can be maintained, and a high-quality thin plate-shaped single crystal 40 having a uniform dopant concentration can be produced continuously.

The atmosphere gas may be prepared according to the characteristics of the material of the thin plate-shaped single crystal 40 to be produced. For example, when an N-type silicon thin plate-shaped single crystal is produced, it is preferable to introduce, as the atmosphere gas, high-purity argon gas containing phosphine ($PH_3$) at an optimum concentration into the chamber 80.

As shown in FIG. 9, for example, the windows 22 for introducing the infrared rays 16 (the laser beams 16a) emitted from the infrared ray irradiation apparatuses 20 into the chamber 80, the reflectors 24 for guiding the infrared rays 16 (the laser beams 16a) introduced into the chamber 80 to the upper surface 14 of the raw material lump 12, etc. may be covered with a cover member 42, and the atmosphere gas may be allowed to be actively introduced from the gas introduction device 90 into the cover member 42.

As described above, by introducing the atmosphere gas into the cover member 42, adhesion of evaporated substances generated from the melt 18 to the windows 22, the reflectors 24, etc. can be prevented, and a high-quality thin plate-shaped single crystal 40 having a uniform dopant concentration can be produced stably and continuously at high yield.

Third Embodiment

Next, a third embodiment of the thin plate-shaped single-crystal production equipment 10 of the present invention will be described.

FIGS. 10 and 11 show the thin plate-shaped single-crystal production equipment 10 in the third embodiment of the present invention.

The thin plate-shaped single-crystal production equipment 10 shown in FIGS. 10 and 11 has basically the same structure as the thin plate-shaped single-crystal production equipment 10 in the first embodiment shown in FIGS. 1 to 7, and the same components are denoted by the same reference numerals. Their detailed description will be omitted, and differences will be described.

As shown in FIGS. 10 and 11, the thin plate-shaped single-crystal production equipment 10 in the third embodiment of the present invention differs from the thin plate-shaped single-crystal production equipment 10 in the first embodiment in that a plurality of the elevator apparatuses 30 (two elevator apparatuses 30 in FIG. 10) are disposed above the raw material lump 12.

Specifically, the two elevator apparatuses 30 (winding apparatuses 50) are arranged in the left-right direction on an upper portion of the chamber 80. Thin plate-shaped seed single crystals 32, 32 are immersed in the melt 18 on the upper surface 14 of the raw material lump 12 and pulled upward using the respective elevator apparatuses 30, 30 (winding apparatuses 50, 50), and thin plate-shaped single crystals 40, 40 can thereby be produced.

When the plurality of elevator apparatuses 30 are disposed above the raw material lump 12 as described above, the efficiency of the production of the thin plate-shaped single crystals 40 can be significantly higher than that when one elevator apparatus 30 is used.

<Thin Plate-Shaped Single-Crystal Production Method>

Next, a thin plate-shaped single-crystal production method using the thin plate-shaped single-crystal production equipment 10 of the present invention will be described.

First, as shown in FIG. 12(a), the raw material lump 12 is placed on the placement table 82 in the chamber 80, and the chamber 80 is sealed. Then the thin plate-shaped seed single crystal 32 is disposed above the upper surface of the raw material lump 12 such that the lengthwise direction of the raw material lump 12 coincides with the extending direction of the thin plate-shaped seed single crystal 32. The thin plate-shaped seed single crystal 32 is suspended from the winding shaft 36 of the winding apparatus 50 using the fine lines 52.

The chamber 80 is evacuated through a discharge pipe (not shown), and an atmosphere gas suitable for the characteristics of the material of the thin plate-shaped single crystal 40 to be produced is introduced into the chamber 80 using a gas introduction device (not shown).

Next, the preheating apparatus 70 is used to increase the temperature of the raw material lump 12 to a temperature close to its melting point. Next, as shown in FIG. 12(b), the infrared ray irradiation apparatuses 20 are used to irradiate the upper surface 14 of the raw material lump 12 with the infrared rays 16 (the laser beams 16a) to melt the upper surface 14.

The irradiation area irradiated with the infrared rays 16 (the laser beams 16a) has a hollow quadrangular shape elongated in the horizontal direction, and the circumferential area, excluding the central portion, of the upper surface 14 of the raw material lump 12 is irradiated with the laser beams 16a such that the hollow quadrangular irradiation area elongated in the horizontal direction is formed in the circumferential area so as to be fitted in the circumferential area.

In this manner, the circumferential area, excluding the central portion, of the upper surface 14 of the raw material lump 12 melts before the central portion melts, and the central portion not irradiated with the laser beams 16a is melted by heat transferred from the melt 18 in the circumferential area melted first.

Next, as shown in FIG. 12(c), the lower surface 34 of the thin plate-shaped seed single crystal 32 is immersed in the central portion of the melt 18 formed on the upper surface 14 of the raw material lump 12 using the elevator apparatus 30 (the winding apparatus 50) to start the growth of a single crystal from the lower surface 34 of the thin plate-shaped seed single crystal 32.

Next, as shown in FIG. 13(a), the elevator apparatus 30 (the winding apparatus 50) is used to pull the thin plate-shaped seed single crystal 32 upward to produce the thin plate-shaped single crystal 40 continuously.

Next, as shown in FIG. 13(b), while the thin plate-shaped single crystal 40 is produced continuously, the position of the placement table 82 is moved upward using the position control apparatus 84. In this manner, although the position of the melt 18 in the raw material lump 12 is lowered as the thin plate-shaped single crystal 40 is pulled up, the position of the raw material lump 12 is controlled such that the initial position is maintained, so that the liquid level of the melt 18 is maintained always at the same level.

When the upper surface 14 of the raw material lump 12 is irradiated with the laser beams 16a vertically from immediately above the raw material lump 12 as in the thin plate-shaped single-crystal production equipment 10 shown in FIGS. 4 and 6, the temperature of the melt 18 is unchanged even when the position of the upper surface 14 of the raw material lump 12 varies. It is therefore unnecessary to control the position of the upper surface 14 of the raw material lump 12 such that the position of the upper surface 14 is maintained at a given position.

Finally, as shown in FIG. 13(c), the amount of irradiation with the infrared rays 16 (the laser beams 16a) from the infrared ray irradiation apparatuses 20 is increased to increase the temperature of the melt 18 to thereby separate the thin plate-shaped single crystal 40 from the melt 18. Then the winding of the continuously produced thin plate-shaped single crystal 40 using the elevator apparatus 30 (the winding apparatus 50) is stopped, and the irradiation with the infrared rays 16 (the laser beams 16a) using the infrared ray irradiation apparatuses 20 is stopped. The production of the thin plate-shaped single crystal 40 is thereby completed.

EXAMPLE

Example 1

The thin plate-shaped single-crystal production equipment 10 of the present invention was used to produce an N-type silicon thin plate-shaped single crystal 40 doped with phosphorus.

The raw material lump 12 used was a cuboidal raw material lump 12 having a width of 400 mm, a thickness of 50 mm, and a height of 500 mm.

The thin plate-shaped seed single crystal 32 used was a silicon thin plate-shaped seed single crystal 32 having a (111) plane, a width of 350 mm, a thickness of 0.3 mm, and a height of 100 mm. One property of silicon is that flat surfaces called facets tend to appear in a (111) plane direction. The flat surfaces were used as plate surfaces of the thin plate-shaped seed single crystal 32. The thin plate-shaped seed single crystal 32 was attached to the winding shaft 36 of the winding apparatus 50 in advance using three fine lines 52.

First, the raw material lump 12 was placed on the placement table 82 in the chamber 80. Then the chamber 80 was closed, and the atmosphere inside the chamber 80 was brought to a vacuum state.

Next, an atmosphere gas was introduced into the chamber 80. The atmosphere gas used was high-purity argon gas, and the required amount of phosphine ($PH_3$) gas for addition of phosphorus was added to the atmosphere gas used.

The raw material lump 12 was first heated to a temperature close to its melting point using the preheating apparatus 70. After the raw material lump 12 had been heated, a circumferential area of the upper surface 14 of the raw material lump 12 excluding its central portion and its outermost circumferential portion was irradiated with laser beams having a width of 20 mm and a length of 396 mm from the left and right sides at an angle of 60° with respect to the horizontal with 2 mm margins from edges. Simultaneously, opposite lengthwise end portions of the raw material lump 12 that were on the centerline of the raw material lump 12 were irradiated with laser beams 16a each having a rectangular irradiation area shape having a width of 6 mm at an angle of 60° with respect to the horizontal with 2 mm margins from edges. The irradiation area has a hollow quadrangular overall shape elongated in the horizontal direction. The entire upper surface 14 was thereby melted.

The winding shaft 36 of the winding apparatus 50 was rotated to immerse the lower surface 34 of the silicon thin plate-shaped seed single crystal 32 in the central portion of the melt 18 obtained by melting. Then the rotation of the winding shaft 36 was reversed to pull the thin plate-shaped seed single crystal 32 upward while a thin plate-shaped single crystal 40 was grown from the lower surface 34 of the thin plate-shaped seed single crystal 32. The thin plate-shaped single crystal 40 was continuously wound into a roll around the winding shaft 36 disposed in an upper portion. The thin plate-shaped single crystal 40 produced was long and had a length of more than 10 m.

The thin plate-shaped seed single crystal 32 was attached to the winding shaft 36 of the winding apparatus 50 using the carbon fiber fine lines 52 having a diameter of about 0.05 mm. By controlling the rotation direction and rotation speed of the winding shaft 36 using the rotating apparatus 38, the thin plate-shaped seed single crystal 32 was moved vertically.

Immediately after the thin plate-shaped seed single crystal 32 had been immersed in the central portion of the melt 18, crystallization started. A portion of the thin plate-shaped seed single crystal 32 that was immersed in the melt 18 was increased in thickness. However, it was found that, when the thin plate-shaped seed single crystal 32 immersed in the melt 18 was left to stand, the thickened portion melted and was reduced in thickness.

The thin plate-shaped seed single crystal 32 in the above state was pulled upward, and the thickness of the thin plate-shaped single crystal 40 produced was checked using a camera. The pulling rate and the irradiation intensity of the laser beams 16a were controlled to adjust the thickness to 0.3 mm, and the winding shaft 36 was rotated to wind the thin plate-shaped single crystal 40 continuously around the winding shaft 36.

When the pulling rate of the thin plate-shaped seed single crystal 32 was reduced, the thickness of the thin plate-shaped single crystal 40 was found to increase. When the pulling rate was increased, the thickness of the thin plate-shaped single crystal 40 was found to decrease. The temperature of the melt was controlled such that the thin plate-shaped single crystal 40 having a thickness of 0.3 mm was continuously pulled upward at a rate of 30 mm per minute.

As the thin plate-shaped single crystal 40 was pulled upward, the liquid level of the melt 18 in the raw material lump 12 was lowered. Therefore, the position of the placement table 82 with the raw material lump 12 placed thereon was adjusted to the prescribed position using the position control apparatus 84 such that the initial position was maintained, so that the liquid level of the melt 18 in the raw material lump 12 was always at the initial level.

The thus-produced long thin plate-shaped single crystal 40 having a length of more than 10 m, a thickness of 0.3 mm, and a width of 383 to 386 mm was subjected to secondary ion mass spectrometry (SIMS). The concentration of phosphorus used as the dopant was found to be uniform at an optimum chemical composition, and the quality of the thin plate-shaped single crystal 40 was found to be high. Therefore, the superiority of the thin plate-shaped single-crystal production equipment 10 of the invention and the thin plate-shaped single-crystal production method of the invention was confirmed.

Next, the above-described thin plate-shaped single-crystal production equipment 10 of the invention and the thin plate-shaped single-crystal production method using the thin plate-shaped single-crystal production equipment 10 will be summarized.

The most significant factor that allows the thin plate-shaped single crystal 40 to be produced continuously and stably using the thin plate-shaped single-crystal production equipment 10 of the invention and the thin plate-shaped single-crystal production method of the invention is that the melting of the raw material lump 12 and the formation of the single crystal from the obtained melt 18 can be controlled substantially independently.

Specifically, heating is necessary to melt the raw material lump 12 to thereby obtain the melt 18, but cooling is necessary to solidify the melt 18 to thereby obtain a crystal. These actions are contradictory.

In the present invention, a portion to be crystallized (the central portion of the melt 18) is not directly irradiated with the laser beams 16a, and a portion excluding the portion to be crystallized (the circumferential area excluding the central portion of the melt 18) is irradiated with the laser beams 16a to melt the upper surface 14 of the raw material lump 12. The heat of the melt 18 transfers to the portion to be crystallized (the central portion of the melt 18), and the melt 18 is formed also in the central portion of the upper surface 14.

In this case, the temperature of the portion to be crystallized (the central portion of the melt 18) is lower than the temperature of the molten portion irradiated with the laser beams 16a (the circumferential area of the melt 18 excluding the central portion), and this facilitates crystallization.

When the thin plate-shaped seed single crystal 32 is immersed in the central portion of the melt 18, the heat of the melt 18 transfers to the immersed lower surface 34 of the thin plate-shaped seed single crystal 32. Therefore, the temperature of the melt in contact with the lower surface 34 decreases, and the crystallization proceeds abruptly. When the immersed lower surface 34 is left to stand for a while, the amount of the heat dissipating through the thin plate-shaped seed single crystal 32 is brought to a steady state. The abruptly solidified portion is gradually melted by the heat from the melt 18 therearound, and a steady state is thereby reached.

When the thin plate-shaped seed single crystal 32 in this state is pulled upward, the thin plate-shaped seed single crystal 32 moves to a low-temperature area, and crystallization proceeds on the lower surface 34 in contact with the melt 18.

When the pulling rate of the thin plate-shaped seed single crystal 32 is increased, the crystallization cannot keep up with the pulling. In this case, the thickness of the thin plate-shaped single crystal 40 produced decreases. When the pulling rate is reduced, the crystallization proceeds, and the thickness of the thin plate-shaped single crystal 40 increases.

When the temperature of the melt 18 is set to be lower, the crystallization is facilitated, and the thickness of the thin plate-shaped single crystal 40 increases. In this case, even when the pulling rate is increased, a thin plate-shaped single crystal 40 having a prescribed thickness can be produced continuously.

The efficiency of production of the thin plate-shaped single crystal 40 can be increased by increasing the pulling rate. However, when the pulling rate is increased excessively, the possibility of the occurrence of cellular growth increases. When the cellular growth occurs, large fluctuations in the concentration of phosphorus serving as the dopant occur locally, and the characteristics of the single crystal deteriorate. It is therefore important to produce the thin plate-shaped single crystal 40 continuously by increasing the pulling rate as much as possible while the occurrence of cellular growth is prevented.

The present invention is the first to allow a high-quality thin plate-shaped single crystal 40 having a uniform chemical composition to be produced even when a so-called non-congruent melting material such as an incongruent melting material or a solid solution single crystal is used. It has been thought that a thin plate-shaped single crystal 40 of a non-congruent melting material that has a uniform chemical composition cannot be produced using a conventional method.

Specifically, to produce a single crystal of a non-congruent melting material that has a uniform chemical composition using the so-called melt method including melting the raw material to form a melt and solidifying the melt to produce the single crystal, there is in principle no method other than the so-called traveling solvent method including producing a raw material lump 12 having a target chemical composition in advance and using a solvent having a solvent chemical composition that coexists in equilibrium with a material having the target chemical composition to cause the raw material lump 12 to melt and the single crystal to precipitate from the solvent simultaneously.

In the present invention, the required amount of a solvent phase component is placed on the upper surface 14 of the raw material lump 12, and then the upper surface 14 is irradiated with the infrared rays 16 to melt the solvent phase component to thereby form a solvent solution. The traveling solvent method is applied by allowing the production of a single crystal from the solvent and melting of the raw material lump 12 into the solvent to proceed simultaneously, and a thin plate-shaped single crystal 40 having a uniform chemical composition can thereby be produced.

The thin plate-shaped single-crystal production equipment 10 of the invention and the thin plate-shaped single-crystal production method using the thin plate-shaped single-crystal production equipment 10 have been described, but the present invention is not limited to the above embodiments.

For example, the first to third embodiments of the thin plate-shaped single-crystal production equipment 10 have been described separately. However, these may be combined and used as the thin plate-shaped single-crystal production equipment 10 of the invention. Specifically, for example, the thin plate-shaped single-crystal production equipment 10 may be a combination of the first embodiment and the second and third embodiments.

In the above examples of the thin plate-shaped single-crystal production equipment 10, the infrared ray irradiation apparatuses 20 are disposed such that the quadrangular shape can be irradiated with the laser beams parallel to the respective sides of the quadrangular shape, but this is not a limitation. Only one infrared ray irradiation apparatus 20 may be used.

The hollow quadrangular irradiation area elongated in the horizontal direction and fitted in the circumferential area, excluding the central portion, of the upper surface 14 of the raw material lump 12 may be formed using a plurality of laser beams 16a, so long as the irradiation area irradiated with the laser beams 16a can form the hollow elongated quadrangular irradiation area. No limitation is imposed on the number of infrared ray irradiation apparatuses 20 and the cross-sectional shape of the laser beam 16a emitted from one infrared ray irradiation apparatus 20.

Specifically, the upper surface 14 of the raw material lump 12 may be irradiated with laser beams 16a each having a square U-shaped cross section from left and right sides such that the two laser beams 16a, 16a having the square U-shaped cross section form the irradiation area having a hollow quadrangular cross-sectional shape elongated in the horizontal direction. Alternatively, four laser beams each having a rod-shaped cross-sectional shape may be used to form the hollow quadrangular irradiation area elongated in the horizontal direction.

In the above description, the thickness of the thin plate-shaped single crystal 40 produced is about 100 μm to about 3000 μm. However, a thin plate-shaped single crystal 40 having a thickness of 5000 μm or more can in principle be produced, and the thickness is not limited to the above range.

In the above description, the thickness of the thin plate-shaped seed single crystal 32 to be immersed in the melt 18 is, for example, about 300 μm to about 500 μm. In this case also, even when the thin plate-shaped seed single crystal 32 has a thickness outside the above range, a thin plate-shaped single crystal 40 can in principle be produced, and the thickness is not limited to the above range.

As described above, the thin plate-shaped single-crystal production equipment 10 of the invention and the thin plate-shaped single-crystal production method of the invention can be modified variously within the scope of the object of the invention.

REFERENCE SIGNS LIST 10 thin plate-shaped single-crystal production equipment
12 raw material lump for production of thin plate-shaped single crystal (raw material lump)
14 upper surface
16 infrared ray
16a laser beam
18 melt
20 infrared ray irradiation apparatus
22 window
24 reflector
30 elevator apparatus
32 thin plate-shaped seed single crystal
34 lower surface
36 winding shaft
38 rotating apparatus
40 thin plate-shaped single crystal
42 cover member
50 winding apparatus
52 fine line
54 supply apparatus
56 supply pipe
60 vibration prevention member
62 blocking member
70 preheating apparatus
80 chamber
82 placement table
84 position control apparatus
90 gas introduction device
92 introduction pipe
94 discharge pipe

The invention claimed is:

1. A thin plate-shaped single-crystal production equipment comprising:
 an infrared ray irradiation apparatus that irradiates an upper surface of a raw material lump for production of a thin plate-shaped single crystal with an infrared ray to melt the upper surface; and
 an elevator apparatus that causes a lower surface of a thin plate-shaped seed single crystal to be immersed in a melt melted using the infrared ray irradiation apparatus and formed on the upper surface and then pulls the thin plate-shaped seed single crystal immersed in the melt upward,
 wherein the thin plate-shaped single-crystal production equipment is configured such that, by using the elevator apparatus to immerse the lower surface of the thin plate-shaped seed single crystal in the melt formed on the upper surface of the raw material lump for the production of the thin plate-shaped single crystal using the infrared ray irradiation apparatus, growth of a single crystal is started from the lower surface of the immersed thin plate-shaped seed single crystal and that, by using the elevator apparatus to pull the thin plate-shaped seed single crystal upward, the thin plate-shaped single crystal is produced continuously,
 wherein the infrared ray emitted from the infrared ray irradiation apparatus is a laser beam, and
 wherein a shape of an irradiation area irradiated with the laser beam is a hollow quadrangular shape elongated in a horizontal direction, the thin plate-shaped single-crystal production equipment being configured for a circumferential area of the upper surface of the raw material lump for the production of the thin plate-shaped single crystal to be irradiated with the laser beam such that the hollow quadrangular irradiation area is formed in the circumferential area of the upper surface, the circumferential area excluding a central portion of the upper surface.

2. The thin plate-shaped single-crystal production equipment according to claim 1, wherein the elevator apparatus includes a winding apparatus that continuously winds the thin plate-shaped single crystal to be produced into a roll, wherein the winding apparatus includes:
 a winding shaft that winds the thin plate-shaped single crystal continuously and
 a rotating apparatus that rotates the winding shaft, and
 wherein the thin plate-shaped single-crystal production equipment is configured such that the thin plate-shaped seed single crystal is suspended from the winding shaft.

3. The thin plate-shaped single-crystal production equipment according to claim 2, wherein the thin plate-shaped seed single crystal is suspended from the winding shaft using a plurality of thin lines.

4. The thin plate-shaped single-crystal production equipment according to claim 3, wherein portions of the thin plate-shaped seed single crystal to which the thin lines are attached each have a thickness equal to or less than a thickness of the thin plate-shaped single crystal to be produced.

5. The thin plate-shaped single-crystal production equipment according to claim 1, wherein a required amount of a liquid phase composition that coexists in equilibrium with a chemical composition of the thin plate-shaped single crystal to be produced is disposed on the upper surface of the raw material lump for the production of the thin plate-shaped single crystal at the beginning of the production.

6. The thin plate-shaped single-crystal production equipment according to claim 1, further comprising a vibration prevention member that is disposed between the elevator apparatus and the raw material lump for the production of the thin plate-shaped single crystal and prevents vibrations of the thin plate-shaped single crystal to be produced continuously.

7. The thin plate-shaped single-crystal production equipment according to claim 1, further comprising a blocking member that is disposed between the elevator apparatus and the raw material lump for the production of the thin plate-shaped single crystal and blocks radiant heat emitted from the melt such that the radiant heat is obstructed from reaching the thin plate-shaped single crystal to be produced continuously.

8. The thin plate-shaped single-crystal production equipment according to claim 1, wherein the raw material lump for the production of the thin plate-shaped single crystal has a substantially cuboidal shape.

9. The thin plate-shaped single-crystal production equipment according to claim 1, wherein dimensions of the upper surface of the raw material lump for the production of the thin plate-shaped single crystal are set to be larger by several millimeters or more than dimensions of the lower surface of the thin plate-shaped seed single crystal in both a thickness direction and a transverse direction.

10. The thin plate-shaped single-crystal production equipment according to claim 1, further comprising:
a placement table on which the raw material lump for the production of the thin plate-shaped single crystal is to be placed; and
a position control apparatus that controls a position of the placement table such that the placement table is positioned at a prescribed position.

11. The thin plate-shaped single-crystal production equipment according to claim 1, wherein the elevator apparatus is configured such that the lower surface of the thin plate-shaped seed single crystal is immersed in a central portion of the melt on the upper surface of the raw material lump for the production of the thin plate-shaped single crystal, the melt being melted using the infrared ray irradiation apparatus.

12. The thin plate-shaped single-crystal production equipment according to claim 1, further comprising a preheating apparatus that is disposed around the raw material lump for the production of the thin plate-shaped single crystal and preheats the raw material lump for the production of the thin plate-shaped single crystal in advance.

13. The thin plate-shaped single-crystal production equipment according to claim 1, wherein at least the raw material lump for the production of the thin plate-shaped single crystal is disposed in a chamber, and wherein the elevator apparatus is disposed on an upper portion of the chamber.

14. The thin plate-shaped single-crystal production equipment according to claim 13, further comprising a gas introduction device that fills the chamber with an atmosphere gas containing a dopant.

15. The thin plate-shaped single-crystal production equipment according to claim 1, wherein a plurality of the elevator apparatuses are disposed above the raw material lump for the production of the thin plate-shaped single crystal.

16. The thin plate-shaped single-crystal production equipment according to claim 1, wherein the thin plate-shaped seed single crystal has a thickness in a range of 300 μm to 500 μm.

17. A thin plate-shaped single-crystal production method comprising at least:
a melting step of melting an upper surface of a raw material lump for production of a thin plate-shaped single crystal by irradiating the upper surface of the raw material lump for the production of the thin plate-shaped single crystal with an infrared ray using an infrared ray irradiation apparatus;
a growing step of starting growth of a single crystal from a lower surface of a thin plate-shaped seed single crystal by immersing the lower surface of the thin plate-shaped seed single crystal in a melt using an elevator apparatus, the melt being formed on the upper surface of the raw material lump for the production of the thin plate-shaped single crystal in the melting step; and
a continuous production step of continuously producing the thin plate-shaped single crystal by pulling upward the thin plate-shaped seed single crystal from which the growth of the single crystal has been started in the growing step,
wherein, in the melting step, the infrared ray emitted from the infrared ray irradiation apparatus is a laser beam, and
wherein a shape of an irradiation area irradiated with the laser beam is a hollow quadrangular shape elongated in a horizontal direction, and a circumferential area of the upper surface of the raw material lump for the production of the thin plate-shaped single crystal is irradiated with the laser beam such that the hollow quadrangular irradiation area is formed in the circumferential area of the upper surface, the circumferential area excluding a central portion of the upper surface.

18. The thin plate-shaped single-crystal production method according to claim 17, further comprising a winding step of, after the continuous production step, winding the thin plate-shaped single crystal produced continuously into a roll.

19. The thin plate-shaped single-crystal production method according to claim 17, wherein, in the melting step, when the thin plate-shaped single crystal to be produced is an incongruent melting material, a required amount of a liquid phase composition that coexists in equilibrium with a chemical composition of the thin plate-shaped single crystal is disposed on the upper surface of the raw material lump for the production of the thin plate-shaped single crystal at the beginning of the production.

20. The thin plate-shaped single-crystal production method according to claim 17, wherein in the melting step, when the thin plate-shaped single crystal to be produced is a solid solution material containing a dopant, a required amount of a liquid phase composition that coexists in equilibrium with a chemical composition of the thin plate-shaped single crystal is disposed on the upper surface of the raw material lump for the production of the thin plate-shaped single crystal at the beginning of the production.

21. The thin plate-shaped single-crystal production method according to claim 17, wherein in the growing step, the lower surface of the thin plate-shaped seed single crystal is immersed in a central portion of the melt formed on the upper surface of the raw material lump for the production of the thin plate-shaped single crystal.

\* \* \* \* \*